United States Patent
Li

(10) Patent No.: US 8,913,428 B2
(45) Date of Patent: *Dec. 16, 2014

(54) PROGRAMMING NON-VOLATILE STORAGE SYSTEM WITH MULTIPLE MEMORY DIE

(71) Applicant: SanDisk Technologies Inc., Plano, TX (US)

(72) Inventor: Yan Li, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/749,968

(22) Filed: Jan. 25, 2013

(65) Prior Publication Data

US 2014/0211561 A1    Jul. 31, 2014

(51) Int. Cl.
*G11C 11/34* (2006.01)
*G11C 11/56* (2006.01)
*G11C 16/34* (2006.01)
*G11C 16/10* (2006.01)

(52) U.S. Cl.
CPC ............ *G11C 16/10* (2013.01); *G11C 11/5628* (2013.01); *G11C 16/3459* (2013.01); *G11C 2216/14* (2013.01); *G11C 2211/5621* (2013.01)
USPC ............ 365/185.03; 365/185.09; 365/185.11; 365/185.19; 365/185.22; 365/201; 365/230.03

(58) Field of Classification Search
USPC ............. 365/185.03, 185.09, 185.11, 185.17, 365/185.22, 201, 230.03
See application file for complete search history.

(56) References Cited

U.S. PATENT DOCUMENTS

| | | | |
|---|---|---|---|
| 5,930,167 | A | 7/1999 | Lee |
| 5,936,884 | A | 8/1999 | Hasbun |
| 6,717,847 | B2 | 4/2004 | Chen |
| 7,196,928 | B2 | 3/2007 | Chen |
| 7,310,347 | B2 | 12/2007 | Lasser |
| 7,388,781 | B2 | 6/2008 | Litsyn |
| 7,440,319 | B2 | 10/2008 | Li |

(Continued)

FOREIGN PATENT DOCUMENTS

EP    1271553    1/2003

OTHER PUBLICATIONS

U.S. Appl. No. 13/749,956, filed Jan. 25, 2013.
U.S. Appl. No. 13/668,160, filed Nov. 2, 2012.

(Continued)

*Primary Examiner* — Fernando Hidalgo
(74) *Attorney, Agent, or Firm* — Vierra Magen Marcus LLP

(57) ABSTRACT

A system and methods for programming a set of data onto non-volatile memory elements, maintaining copies of the data pages to be programmed, as well as surrounding data pages, internally or externally to the memory circuit, verifying programming correctness after programming, and upon discovering programming error, recovering the safe copies of the corrupted data to be reprogrammed in alternative non-volatile memory elements. Additionally, a system and methods for programming one or more sets of data across multiple die of a non-volatile memory system, combining data pages across the multiple die by means such as the XOR operation prior to programming the one or more sets of data, employing various methods to determine the correctness of programming, and upon identifying data corruption, recovering safe copies of data pages by means such as XOR operation to reprogram the pages in an alternate location on the non-volatile memory system.

20 Claims, 22 Drawing Sheets

(56) References Cited

U.S. PATENT DOCUMENTS

| | | |
|---|---|---|
| 7,570,520 B2 | 8/2009 | Kamei |
| 7,885,119 B2 | 2/2011 | Li |
| 8,111,548 B2 * | 2/2012 | Mokhlesi ............ 365/185.03 |
| 8,448,043 B2 * | 5/2013 | Seo et al. ................ 714/763 |
| 2004/0210708 A1 | 10/2004 | Conley |
| 2006/0126390 A1 | 6/2006 | Gorobets |
| 2006/0209596 A1 | 9/2006 | Li |
| 2007/0180346 A1 | 8/2007 | Murin |
| 2008/0123412 A1 | 5/2008 | Lasser |
| 2008/0170443 A1 | 7/2008 | Jung |
| 2008/0177934 A1 | 7/2008 | Yu |
| 2008/0198664 A1 | 8/2008 | Mokhlesi |
| 2008/0259684 A1 | 10/2008 | Shlick |
| 2009/0089481 A1 | 4/2009 | Kapoor |
| 2010/0318839 A1 | 12/2010 | Avila |
| 2011/0066793 A1 | 3/2011 | Burd |
| 2012/0144249 A1 | 6/2012 | Franceschini |
| 2012/0236670 A1 | 9/2012 | Hemink |
| 2012/0265923 A1 | 10/2012 | Kuo |
| 2012/0314502 A1 | 12/2012 | Mokhlesi |
| 2014/0043897 A1 * | 2/2014 | Pan et al. ............ 365/185.03 |

OTHER PUBLICATIONS

PCT International Search Report dated Jun. 16, 2014, PCT Application No. PCT/US2014/012879.

PCT Written Opinion of the International Searching Authority dated Jun. 16, 2014, PCT Application No. PCT/US2014/012879.

PCT International Search Report dated Apr. 29, 2014, PCT Application No. PCT/US2014/012876.

PCT Written Opinion of the International Searching Authority dated Apr. 29, 2014, PCT Application No. PCT/US2014/012876.

Office Action dated Sep. 26, 2014, U.S. Appl. No. 13/749,956.

* cited by examiner

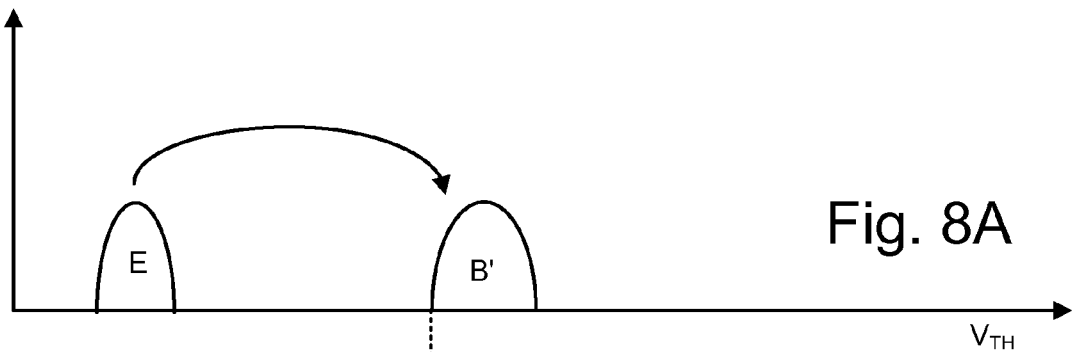
Fig. 8A
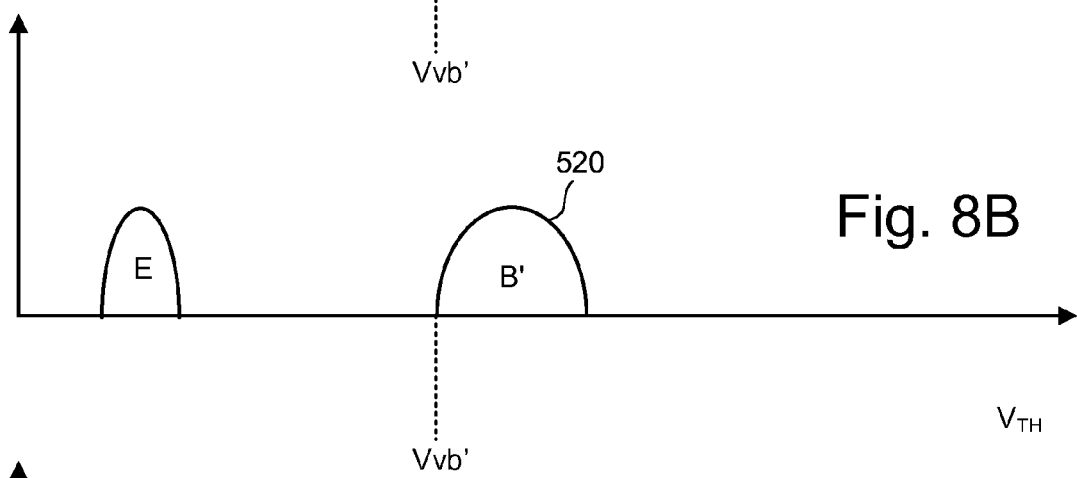
Fig. 8B
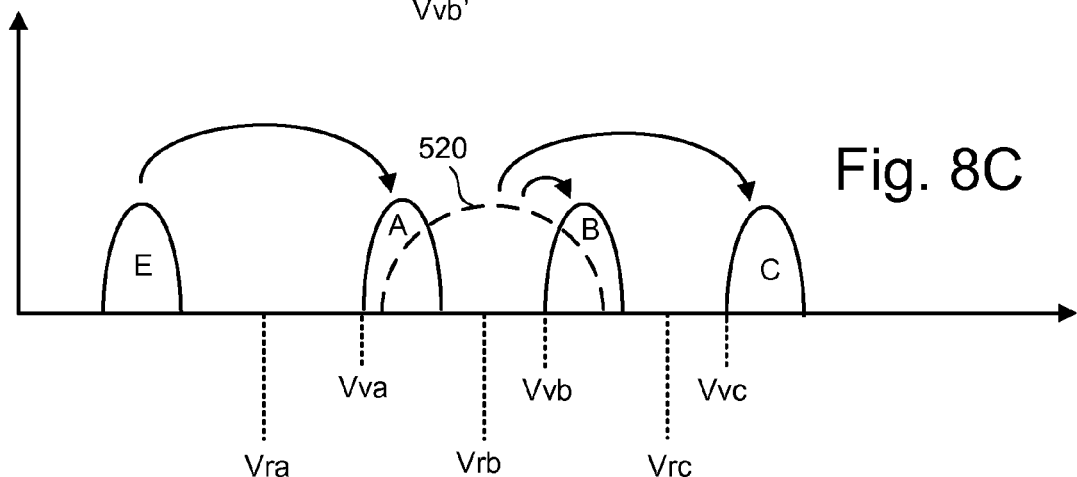
Fig. 8C
| | State E | State A | State B | State C |
|---|---|---|---|---|
| Upper Page | 1 | 0 | 0 | 1 |
| Lower Page | 1 | 1 | 0 | 0 |
Fig. 9

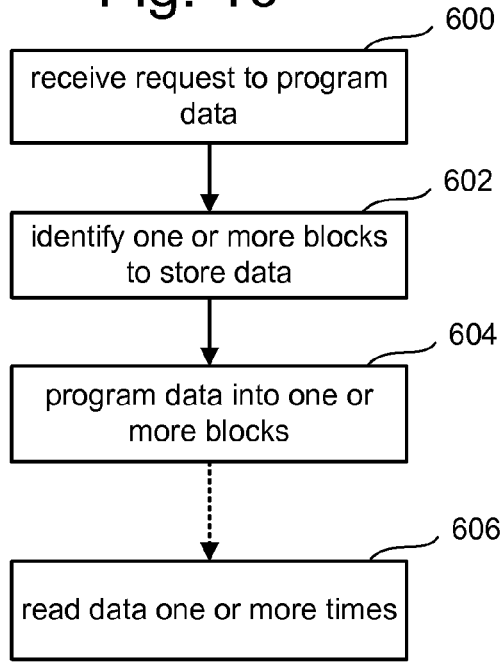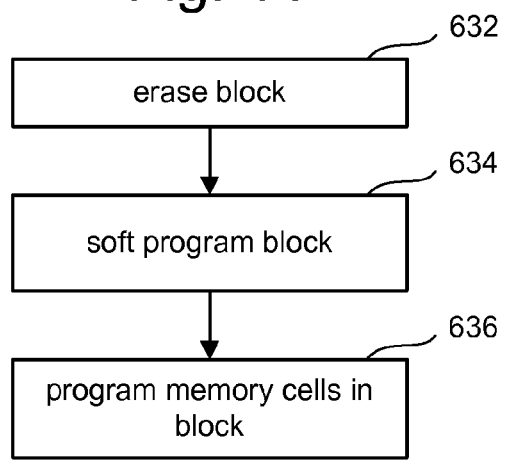

| Sequential page entry table for XOR tracking |||||
| Entry # | Page # | Block# | Plane# | Die # |
| --- | --- | --- | --- | --- |
| 1 | | | | |
| 2 | | | | |
| | | | | |
| | | | | |
| | | | | |
| | | | | |
| | | | | |
| | | | | |
| 100 | | | | |

PROGRAMMING NON-VOLATILE STORAGE SYSTEM WITH MULTIPLE MEMORY DIE

BACKGROUND OF THE INVENTION

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and in U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states: an erased state and a programmed state (corresponding to data "1" and data "0"). Such a device is referred to as a binary device or a single-level cell (SLC) and the data is binary data.

A multi-state flash memory cell (storing multi-state data) is implemented by identifying multiple, distinct allowed threshold voltage ranges. Each distinct threshold voltage range corresponds to a predetermined value for the set of data bits. For example, some cells can store 2 bits, and others can store 3 bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

In addition to the gains in capacity resulting from multi-state memory architectures, consumers have seen significant advantages as a result of a history of steadily scaling down the physical dimensions of memory cells. Smaller memory cells can be packed more densely on a given die area, allowing the user to access more memory capacity for the same price as an older memory technology. The shrinking of gate areas decreases the floating-gate-to-substrate capacitance as well as the control-gate-to-floating-gate capacitance. This decrease in capacitance in turn requires less charge for programming and erasing cells, thus consuming less power. The decrease in charge required for programming and erasing cells also means that, for similar charging and discharging currents, programming and erasing operations can be performed more quickly.

However, scaling the sizes of memory cells entails certain risks. As stated above, in order to achieve the advantage of higher memory capacity for a fixed die size, these smaller cells must be packed more closely together. Doing so, however, may result in a greater number of manufacturing errors, such as shorting between the word lines. Such errors usually corrupt any data stored on pages on the word lines being programmed and neighboring word lines. In some cases, these defects are not be realized during tests conducted by manufacturers prior to packaging and shipping. Rather, these defects only begin to corrupt data after program-erase cycles performed by the user.

For some memory systems, a technology known as Enhanced Post-Write Read (EPWR) exists in order to test for errors during programming. Data is first programmed into binary memory cells storing one bit per memory cell. Subsequently, data is re-programmed into multi-state memory cells storing three bits per memory cells. After programming the data into the multi-state memory cells that store three bits per memory cell, the data programmed is read and compared against that stored in the binary memory cells for verification of correct programming. If a difference is found, the block of multi-state memory cells is considered to be damaged and, therefore, retired from future use. The data is then re-programmed elsewhere. While this process has been useful, it does not satisfy all issues and can be expensive as the system needs to maintain blocks of memory cells to initially store the data before programming to multi-state memory cells. Additionally, this process results in a performance penalty and requires a larger amount of program/erase cycles.

DESCRIPTION OF THE DRAWINGS

FIGS. 8A-8C depict examples of threshold voltage distributions and an example programming process.

FIG. 9 is a table showing one example of a relationship between threshold voltage distributions and data stored in memory cells.

FIG. 10 is a flow chart describing one embodiment of a process for operating non-volatile storage.

FIG. 11 is a flow chart describing one embodiment of a process for programming non-volatile storage.

DETAILED DESCRIPTION

Described herein are a systems and methods by which data can be preserved internally or externally to a memory circuit for verification purposes, such that if a programming operation for that data fails on a certain region of the memory circuit, the data preserved through one or more copies can be programmed elsewhere on the memory circuit. In some embodiments, the failed region of the memory circuit, which can be a page, a block, one or more word lines, or region of some other size, can be marked to prevent future programming attempts. If the programming operation was successful, then all or a portion of the preserved data can be release from the redundant storage.

For example, in the case of detecting possible short circuits between word lines (or other defects), some embodiments of the present technology may preserve the data on pages physically close to the page(s) being programmed. This data may be kept on external data latches, controller RAM, other locations on the NAND memory, or elsewhere. Embodiments of the technology can be used whether pages in the memory are programmed sequentially or randomly.

In embodiments wherein the memory circuit consists of multiple memory die, methods for preserving data pages may include the use of one or more XOR operations (or other logical/mathematical operations) in order to combine or compress the data for more efficient storage. Specifically, corresponding regions of each die may be combined together via one or more XOR operations (or other logical/mathematical operations) either on or off the memory die while part or all of one or more of those regions is being programmed. After the programming operation is complete, in order to verify that the programming operation was successful, the system may read the data page/s that were programmed and/or data surrounding the newly programmed pages. If any of these read operations fail, the system may perform one or more XOR operations (or other logical/mathematical operations) on the stored data with the regions not currently programmed, thus recovering a safe copy of the original data to be programmed. The system may then locate a free region of memory on which to program the saved copy. In embodiments, the saved copy may be erased after a successful programming operation or a successful data recovery.

Embodiments will now be described with reference to the drawings enclosed with this document.

Figure 1:
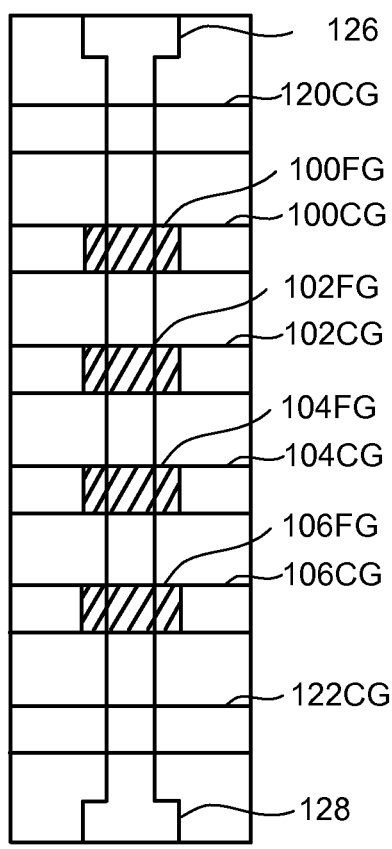
FIG. 1 is a top view of a NAND string.
Figure 2:
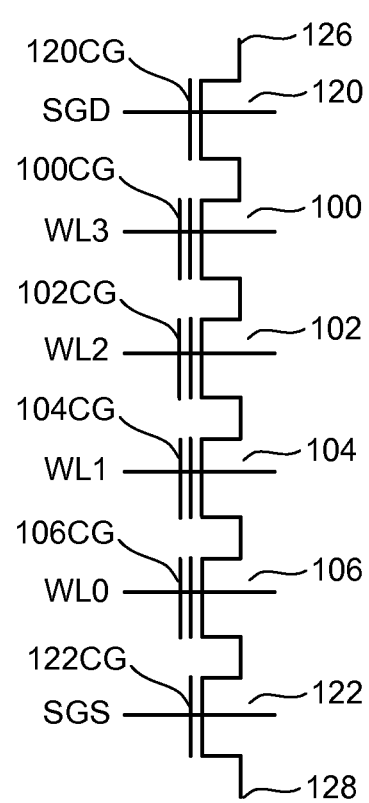
FIG. 2 is an equivalent circuit diagram of the NAND string.

One example of a non-volatile storage system that can be used to implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (drain side) select gate 120 and a second (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. patents/patent applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used. For example, non-volatile memory devices are also manufactured from memory cells that use a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Non-volatile storage based on MONOS or TANOS types of structures or nanocrystals can also be used. Other types of non-volatile storage can also be used.

Figure 3:
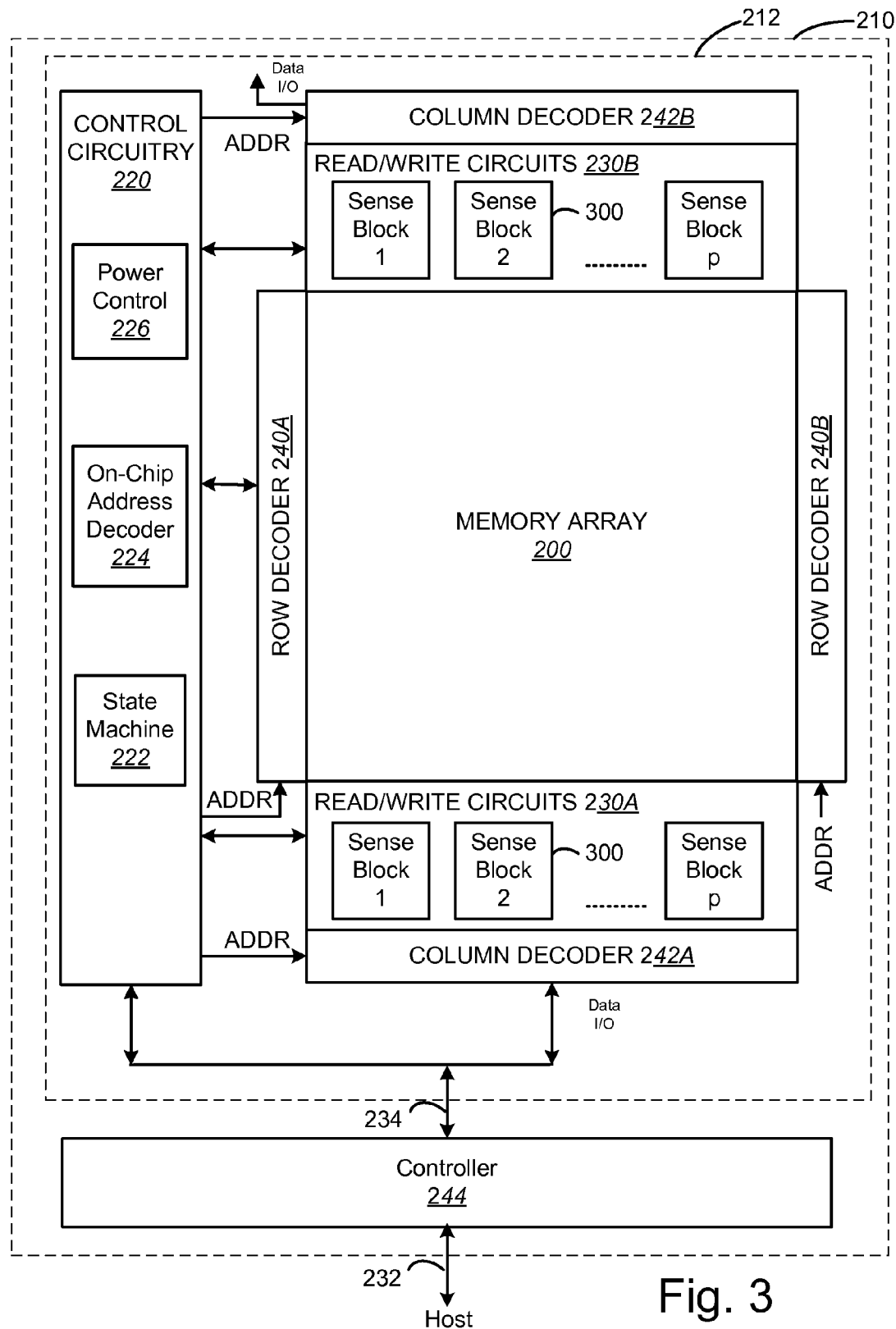
FIG. 3 is a block diagram of a non-volatile memory system.

FIG. 3 illustrates a memory device 210 having read/write circuits for reading and programming a page (or other unit) of memory cells (e.g., NAND multi-state flash memory) in parallel. Memory device 210 may include one or more memory die 212. Memory die (or integrated circuit) 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-die address decoder 224, and a power control module 226. The state machine 222 provides die-level control of memory operations. The on-die address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220 provides address lines ADDR to row decoders 240A and 204B, as well as column decoders 242A and 242B. Column decoders 242A and 242B provide data to controller 244 via the signal lines marked Data I/O. Temperature sensor 228 can be an analog or digital temperature sensor known in the art.

In one embodiment, controller 244 is implemented on a different die (or integrated circuit) than memory die 212. In some embodiments, the controller 244 interfaces with the Host and with control circuitry 220 as well as the decoders. In some embodiments, controller 244 interfaces with the read/write circuits.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. The one or more managing circuits perform the processes described herein.

Figure 4:
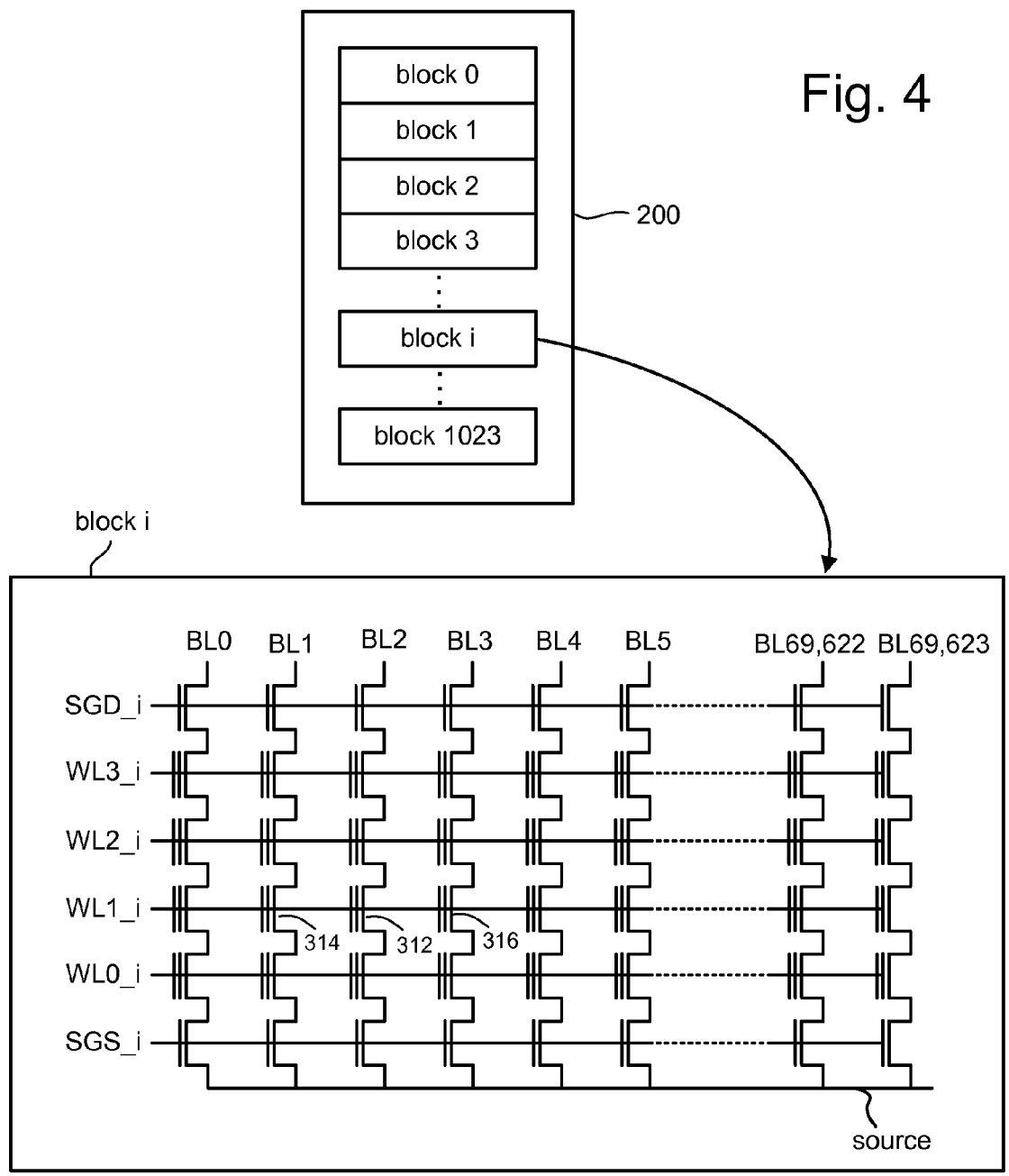
FIG. 4 is a block diagram depicting one embodiment of a memory array.

FIG. 4 depicts an exemplary structure of memory cell array 200. In one embodiment, the array of memory cells is divided into a large number of blocks (e.g., blocks 0-1023, or another amount of blocks) of memory cells. As is common for flash memory systems, the block is the unit of erase. That is, each block contains the minimum number of memory cells that are erased together. Other units of erase can also be used.

A block contains a set of NAND strings which are accessed via bit lines (e.g., bit lines BL0-BL69,623) and word lines (WL0, WL1, WL2, WL3). FIG. 4 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. A page can store one or more sectors. A sector includes user data and overhead data (also called system data). A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used. Additionally, a block can have more or less than 69,624 bit lines.

Figure 5:
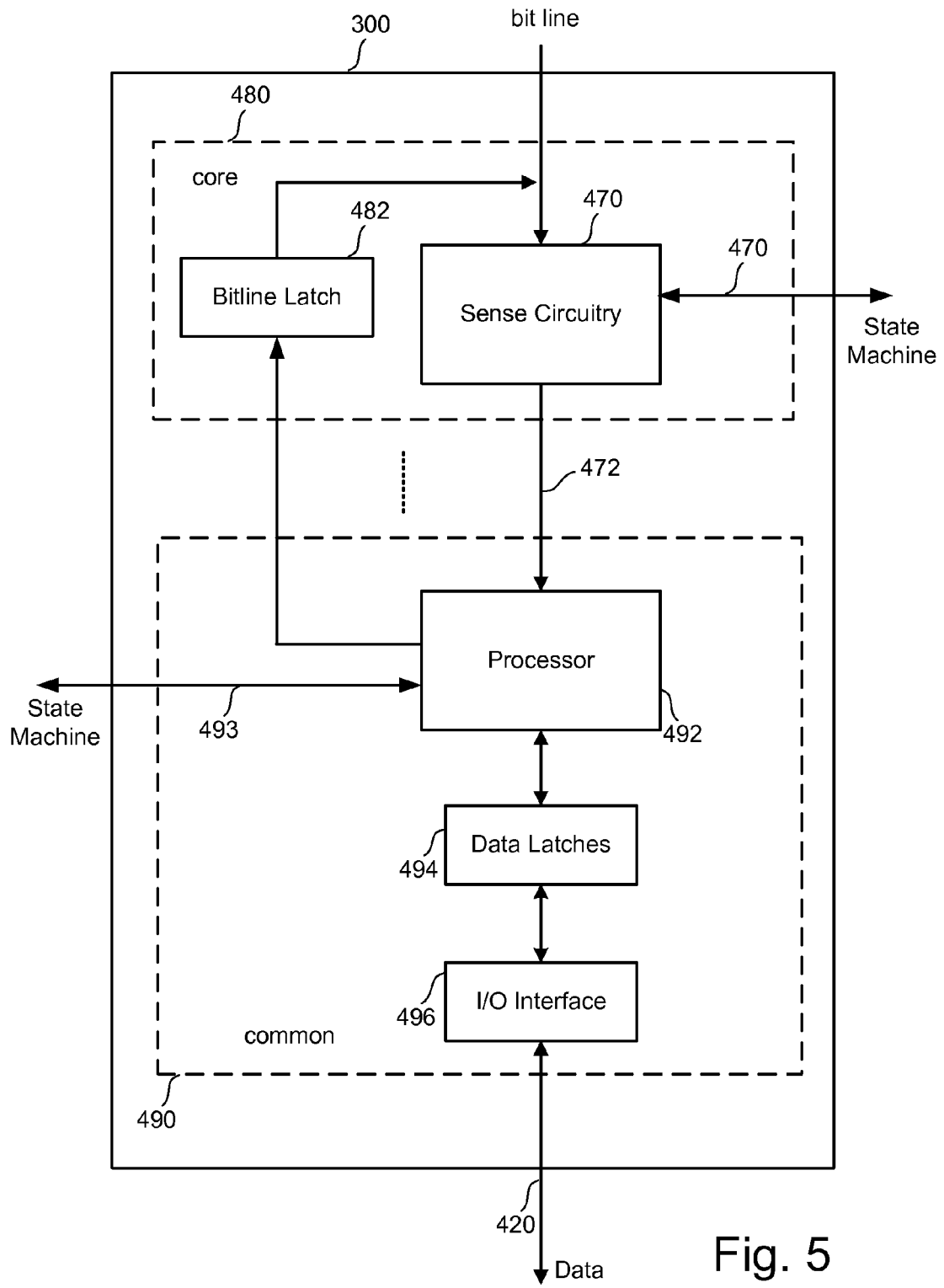
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. One example can be found in U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd) in order to lock out memory cells from programming.

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. Patent Application Publication No. 2006/0158947, titled "Reference Sense Amplifier For Non-Volatile Memory," Inventors Siu Lung Chan and Raul-Adrian Cernea, filed on Dec. 28, 2005. All five of the immediately above-listed patent documents are incorporated herein by reference in their entirety.

Figure 6:
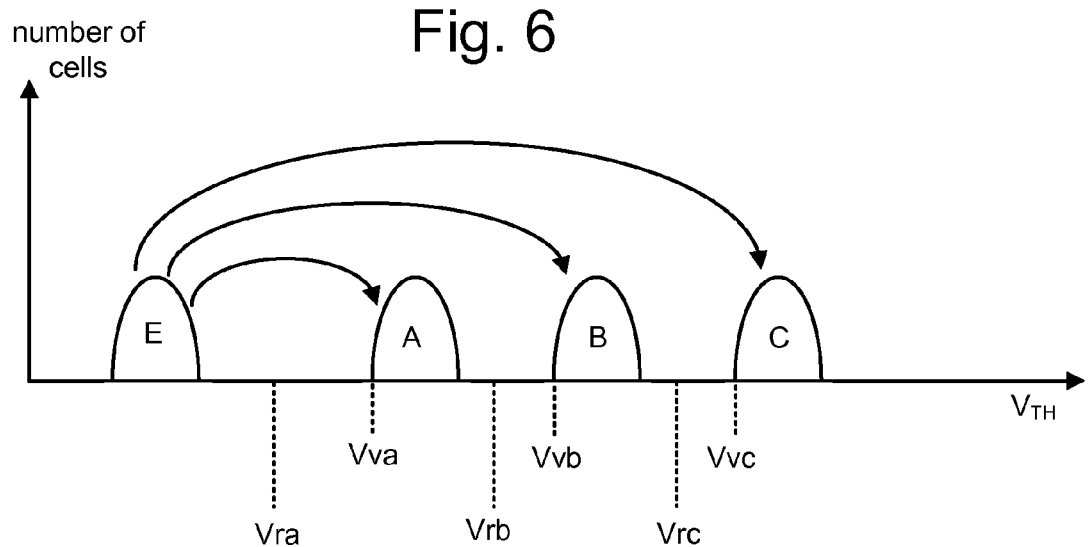
FIG. 6 depicts an example set of threshold voltage distributions and depicts an example programming process.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions (corresponding to data states) for the memory cell array when each memory cell stores two bits of data. Other embodiments, however, may use more or less than two bits of data per memory cell (e.g., such as three, or four or more bits of data per memory cell). The technology described herein is not limited to any specific number of bits per memory cell.

FIG. 6 shows a first threshold voltage distribution E for erased memory cells. Three threshold voltage distributions A, B and C for programmed memory cells are also depicted. In one embodiment, the threshold voltages in the E distribution are negative and the threshold voltages in the A, B and C distributions are positive. Each distinct threshold voltage distribution of FIG. 6 corresponds to predetermined values for the set of data bits. The specific relationship between the data programmed into the memory cell and the threshold voltage levels of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 6 shows four states, the present invention can also be used with other multi-state structures including those that include more or less than four states.

FIG. 6 also shows three read reference voltages, Vra, Vrb and Vrc (also called read compare levels/values), for reading data from memory cells. By testing whether the threshold voltage of a given memory cell is above or below Vra, Vrb and Vrc, the system can determine what state the memory cell is in. For example, if a memory cell has a threshold voltage less than Vra, it is assumed to be in state E. If a memory cell has a threshold voltage less than Vrb and greater than Vra, it is assumed to be in state A. If a memory cell has a threshold voltage less than Vrc and greater than Vrb, it is assumed to be in state B. If a memory cell has a threshold voltage greater than Vrc, it is assumed to be in state C.

FIG. 6 also shows three verify reference voltages, Vva, Vvb and Vvc (also called verify compare values/levels). When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erase state E directly to any of the programmed states A, B or C. For example, a population of memory cells to be programmed may first be erased so that all memory cells in the population are in erased state E. Then, a programming process is used to program memory cells directly into states A, B or C. While some memory cells are being programmed from state E to state A, other memory cells are being programmed from state E to state B and/or from state E to state C.

Figure 7:
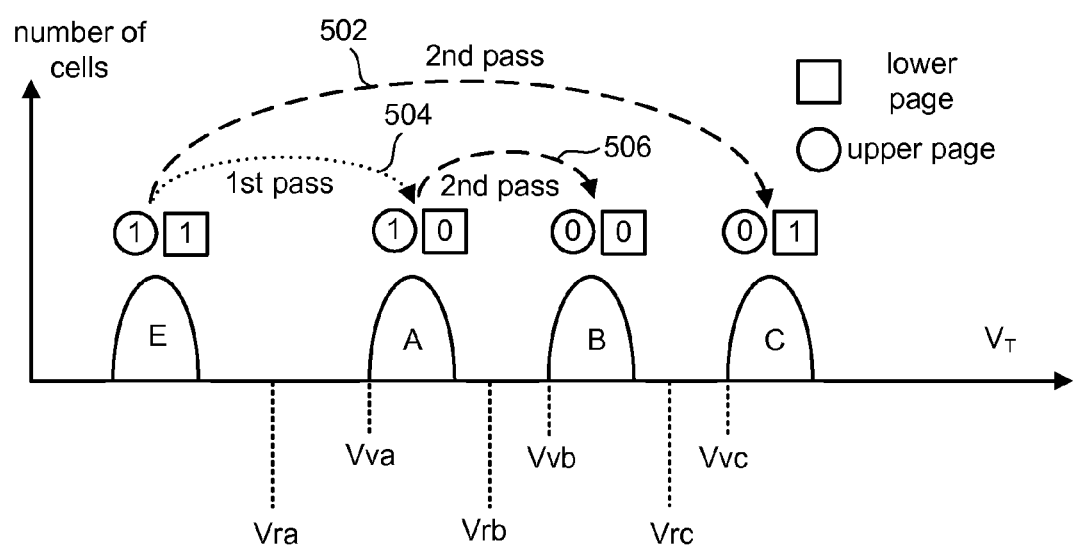
FIG. 7 depicts an example set of threshold voltage distributions and depicts an example programming process.

FIG. 7 illustrates one example of a two-stage technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming stage, the memory cells' threshold voltages levels are set according to the bit to be programmed into the lower logical page. If that bit is a logic "1," the threshold voltage is not changed since the respective memory cell is in the appropriate state as a result of having been earlier erased. However, if the bit to be programmed is a logic "0," the threshold level of the cell is increased to be state A, as shown by arrow 504. That concludes the first programming stage.

In a second programming stage, the memory cell's threshold voltage level is set according to the bit being programmed into the upper logical page. If the upper logical page bit is to store a logic "1," then no programming occurs since the memory cell is in one of states E or A, depending upon the programming of the lower page bit, both of which carry an upper page bit of "1." If the upper page bit is to be a logic "0," then the threshold voltage is shifted. If the first stage resulted in the memory cell remaining in the erased state E, then in the second stage the memory cell is programmed so that the threshold voltage is increased to be within state C, as depicted by arrow 502. If the memory cell had been programmed into state A as a result of the first programming stage, then the memory cell is further programmed in the second stage so that the threshold voltage is increased to be within state B, as depicted by arrow 506. The result of the second stage is to program the memory cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application 2006/0126390, incorporated herein by reference in its entirety.

FIGS. 8A-C describe another multi-stage programming process for programming non-volatile memory. The process of FIG. 8A-C reduces floating gate to floating gate coupling by, for any particular memory cell, writing to that particular memory cell with respect to a particular page subsequent to writing to adjacent memory cells for previous pages. In one example of an implementation of the process taught by FIGS. 8A-C, the non-volatile memory cells store two bits of data per memory cell, using four data states. For example, assume that state E is the erased state and states A, B and C are the programmed states. FIG. 9 shows one example of the relationship between states and data stored. State E stores data 11. State A stores data 01. State B stores data 00. State C stores data 10 This is an example of Gray coding. Other encodings of data to physical data states can also be used. Each memory cell stores two pages of data. For reference purposes, these pages of data will be called upper page and lower page; however, they can be given other labels. With reference to state A for the process of FIGS. 8A-C, the upper page stores data 0 and the lower page stores data 1. With reference to state B, both pages stores data 0. With reference to state C, the lower pages stores data 0 and the upper page stores data 1.

The programming process of FIGS. 8A-C is a two-stage programming process; however, the process of FIGS. 8A-C can be used to implement a three stage process, a four stage process, etc. In the first stage, the lower page is programmed. If the lower page is to remain data 1, then the memory cell state remains at state E. If the lower page data is to be programmed to 0, then the threshold of voltage of the memory cell is raised such that the memory cell is programmed to state B'. FIG. 8A shows the programming of memory cells from state E to state B'. State B' depicted in FIG. 8A is an interim state B; therefore, the verify point is depicted as Vvb', which is lower than Vvb.

In one embodiment, after a memory cell is programmed from state E to state B', its neighbor memory cell (on word line WLn+1) in the NAND string will then be programmed with respect to its lower page. After programming the neighbor memory cell, the floating gate to floating gate coupling effect may raise the apparent threshold voltage of earlier programmed memory cell. This will have the effect of widening the threshold voltage distribution for state B' to that depicted as threshold voltage distribution 520 of FIG. 8B. This apparent widening of the threshold voltage distribution will be remedied when programming the upper page.

FIG. 8C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 520 and the upper page data is to remain at 1, then the memory cell will be programmed to final state C. If the memory cell is in intermediate threshold voltage distribution 520 and the upper page data is to become data 0, then the memory cell will be to state B. The process depicted by FIGS. 8A-C reduces the effect of floating gate to floating gate coupling because only the upper page programming of neighbor memory cells will have an effect on the apparent threshold voltage of a given memory cell.

Although FIGS. 8A-C provide an example with respect to four data states and two pages of data, the concepts taught by FIGS. 8A-C can be applied to other implementations with more or less than four states and different than two pages. More details about the programming process of FIG. 8A-C can be found in U.S. Pat. No. 7,196,928, incorporated herein by reference.

FIG. 10 is a flow chart describing one embodiment of a process for operating non-volatile memory, such as the system of FIG. 3 (or other systems). In step 600, a request to program data is received. The request can be from a host, another device or the controller. The request can be received at the controller, control circuitry, state machine, or other device. In response to the request, the controller, control circuitry, state machine, or other component will determine which block of flash memory cells will be used to store the data in step 602. The data will be programmed into the determined block using any of the programming processes described above (or other programming processes) in step 604. The programmed data will be read one or many times in step 606. There is a dashed line between steps 604 and 606 because an unpredictable amount of time may pass between the steps, and step 606 is not performed in response to step 604. Rather, step 606 is performed in response to a request to read the data or other event.

FIG. 11 is a flow chart describing a programming process for programming memory cells in a block. The process of FIG. 11 is one embodiment of step 604 of FIG. 10. In step 632, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. A strong electric field is, thus, applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of the selected memory cells is lowered. Erasing can be performed on the entire memory array, on individual blocks, or another unit of cells. Other techniques for erasing can also be used.

In step 634, soft programming is performed to narrow the threshold voltage distribution of the erased memory cells. Some memory cells may be in a deeper erased state than necessary as a result of the erase process. Soft programming can apply programming pulses to move the threshold voltage of the deeper erased memory cells to a higher threshold voltage that is still in a valid range for the erased state. In step 636, the memory cells of the block are programmed as described herein. The process of FIG. 11 can be performed at the direction of the state machine, controller or combination of state machine and controller, using the various circuits described above. For example, the controller may issue commands and data to the state machine to program the data. In response, the state machine may operate the circuits described above to carry out the programming operations.

Figure 12:
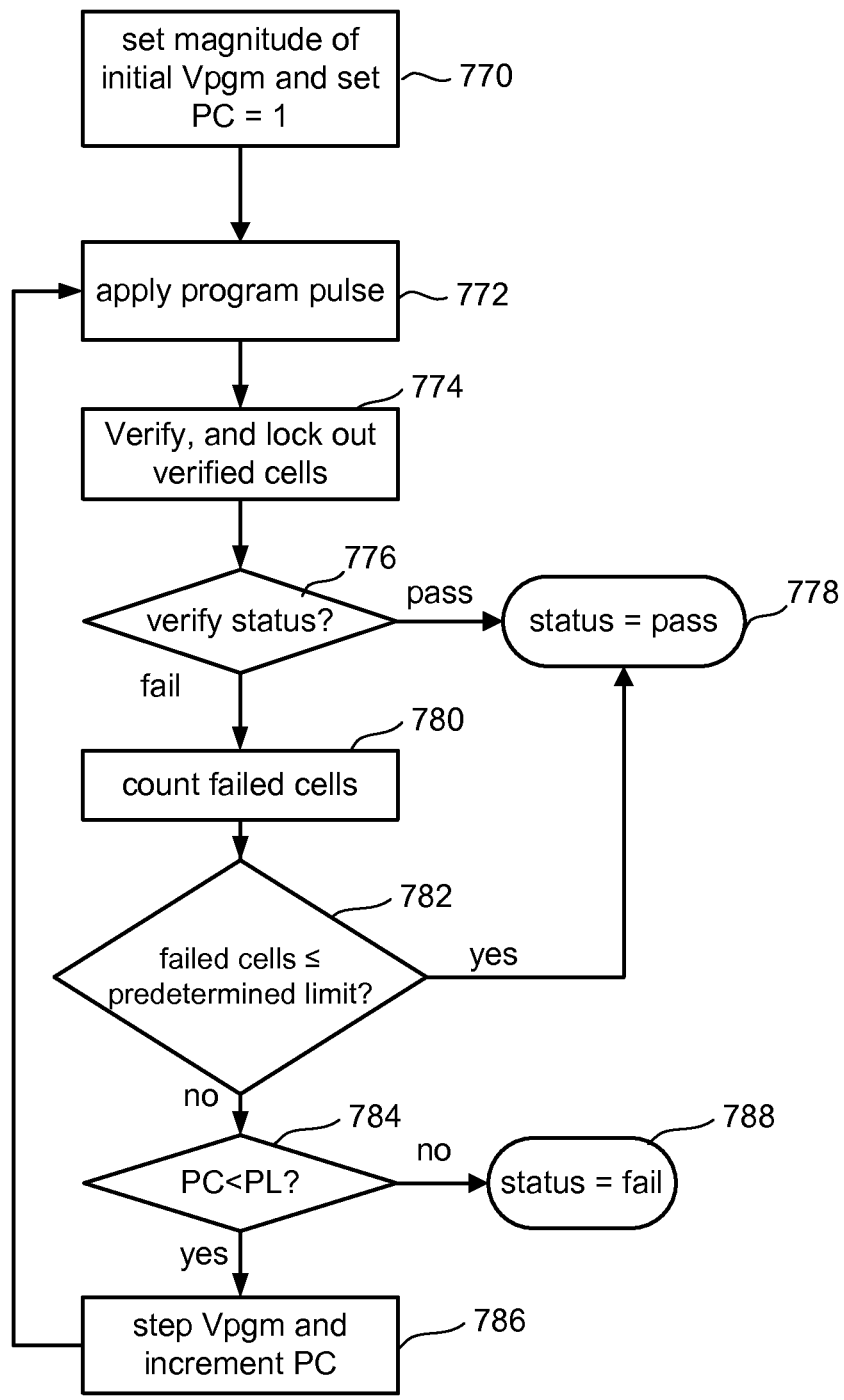
FIG. 12 is a flow chart describing one embodiment of a process for performing programming operations for non-volatile storage.

FIG. 12 is a flow chart describing one embodiment of a process for performing programming on one or more memory cells connected to a common word line. Therefore, when programming a block of memory cells the process of FIG. 12 is performed one or more times for each word line of the block. The process of FIG. 12 can be performed one or multiple times during step 636 of FIG. 11. For example, the process of FIG. 12 can be used to program memory cells (e.g., full sequence programming) from state E directly to any of states A, B or C. Alternatively, the process of FIG. 12 can be used to perform one or each of the stages of the process of FIG. 7, FIGS. 8A-C, or other programming schemes. For example, when performing the process of FIGS. 8A-C, the process of FIG. 12 is used to implement the first stage that includes programming some of the memory cells from state E to state B'. The process of FIG. 12 can then be used again to implement the second stage that includes programming some of the memory cells from state E to state A and from state B' to states B and C.

Typically, the program voltage applied to the control gate during a program operation is applied as a series of program pulses. Between programming pulses are a set of one or more verify pulses to perform verification. In many implementations, the magnitude of the program pulses is increased with each successive pulse by a predetermined step size. In step 770 of FIG. 12, the programming voltage (Vpgm) is initialized to the starting magnitude (e.g., ~12-16V or another suitable level) and a program counter PC maintained by state machine 222 is initialized at 1.

In step 772, a program pulse of the program signal Vpgm is applied to the selected word line (the word line selected for programming). In one embodiment, the memory cells being programmed are all connected to the same word line (the selected word line). The unselected word lines receive one or more boosting voltages (e.g., ~9 volts) to perform boosting schemes known in the art in order to avoid program disturb. There are many different boosting schemes that can be used with the technology described herein. In one embodiment, if a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line that should be programmed are programmed concurrently. That is, they are programmed at the same time (or during overlapping times). In this manner all of the memory cells connected to the selected word line will concurrently have their threshold voltage change, unless they have been locked out from programming.

In step 774, the appropriate memory cells are verified using the appropriate set of target levels to perform one or more verify operations. If a memory cell is verified to have reached its target, it is locked out from further programming. One embodiment for locking out a memory cell from further programming is to raise the corresponding bit line voltage to, for example, Vdd.

In step 776, it is determined whether all the memory cells have reached their target threshold voltages. If so, the programming process is complete and successful because all selected memory cells were programmed and verified to their target states. A status of "PASS" is reported in step 778. If, in 776, it is determined that not all of the memory cells have reached their target threshold voltages, then the programming process continues to step 780.

In step 780, the system counts the number of memory cells that have not yet reached their respective target threshold voltage distribution. That is, the system counts the number of memory cells that have failed the verify process. This counting can be done by the state machine, the controller, or other logic. In one implementation, each of the sense blocks 300 (see FIG. 3) will store the status (pass/fail) of their respective memory cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed. In one embodiment, there is one total counted, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782. In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If the number of failed cells is not less than the predetermined limit, than the programming process continues at step 784 and the program counter PC is checked against the program limit value (PL). One example of a program limit value is 20; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

During verify operations (e.g., step 774) and read operations, the selected word line is connected to a voltage, a level of which is specified for each read operation (e.g., Vra, Vrb, and Vrc) or verify operation (e.g. Vva, Vvb, and Vvc) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The erase, read and verify operations described above are performed according to techniques known in the art. Thus, many of the details explained can be varied by one skilled in the art. Other erase, read and verify techniques known in the art can also be used.

Figure 13:
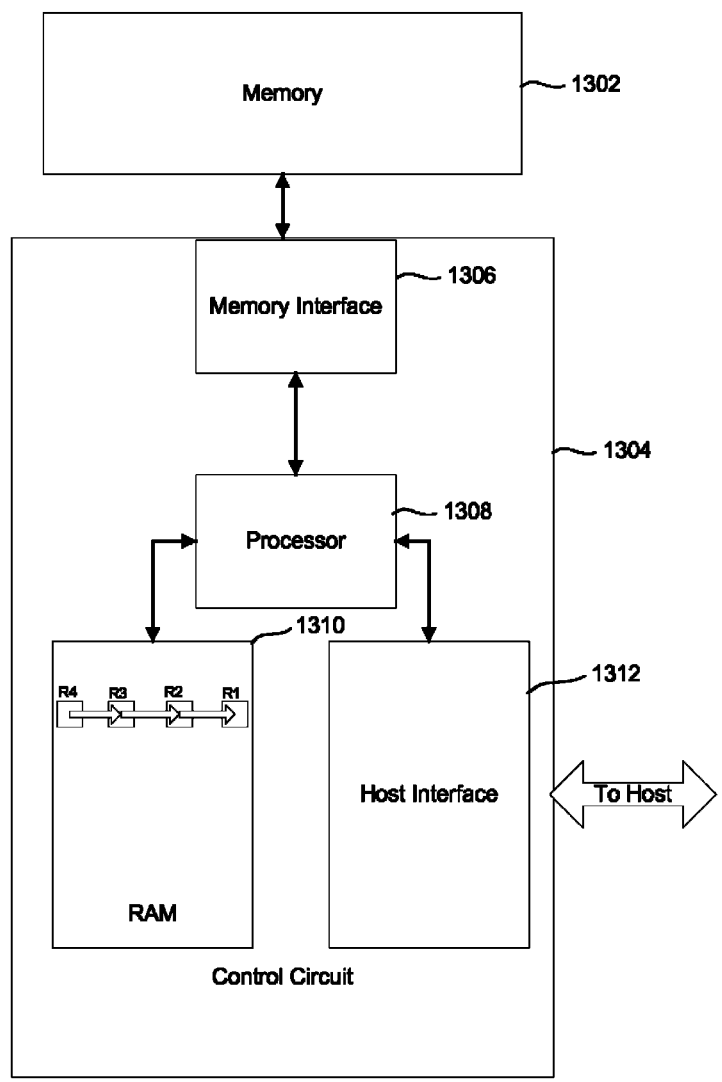
FIG. 13 is a block diagram depicting one embodiment of a system comprising a memory die and a controller circuit.

FIG. 13 is a block diagram showing one example physical circuit capable of technology the methods disclosed herein. The depicted circuit comprises a memory die 1302 in communication with one or more control circuits 1304 (though FIG. 13 shows only one control circuit, other embodiments may feature more control circuits). The memory die 1302 may comprise memory array 200 (including a memory die) and its connected components, as shown in FIG. 2, whereas control circuit/s 1304 may comprise (at least in part) controller 244, also featured in FIG. 2. In one embodiment, the non-volatile storage elements on memory die 1302 are NAND memory cells that store two bits of data, but may in other embodiments the memory cells can store more than two bits per memory cell.

In one embodiment, control circuit/s 1304 may comprise memory interface 1306, processor 1308, RAM 1310, and host interface 1312. The memory interface 1306 is the primary means by which output data from processor 1306 is fed into memory die 1302. Alternatively, the system may use the memory interface to feed the processor with data communicated from the memory die. The memory interface may also include addressing circuitry that determines where on the memory die data is to be written and from where data is to be read. Processor 1308 performs logical and arithmetical operations on data received from host interface 1312, RAM 1310, and memory interface 1306 in order to determine which data is to be stored on the memory die, which to be stored locally on RAM, and which data is to be communicated to the host through the host interface. Host interface, as shown, is connected to the host device, and is the system which manages bidirectional communication between controller processor 1308 and the host device. By way of example only, if the disclosed methods and systems are embodied in the memory card of a digital camera (or other host), then the host interface may enable the circuitry of FIG. 13 to engage in two-way communication with the other electronics employed in the functioning of the camera (or other host). RAM 1310 may function as local storage that caches data, such that this data is either to be moved to memory 1302 or to be retrieved from the memory 1302 before the processor relays this data to the host interface. In particular, RAM 1310 includes a set of registers (R1, R2, R3, R4, . . . ) or memory locations that act as registers such that these registers can store discrete sets of data and pass this data to each other, as depicted in FIG. 13.

Figure 14:
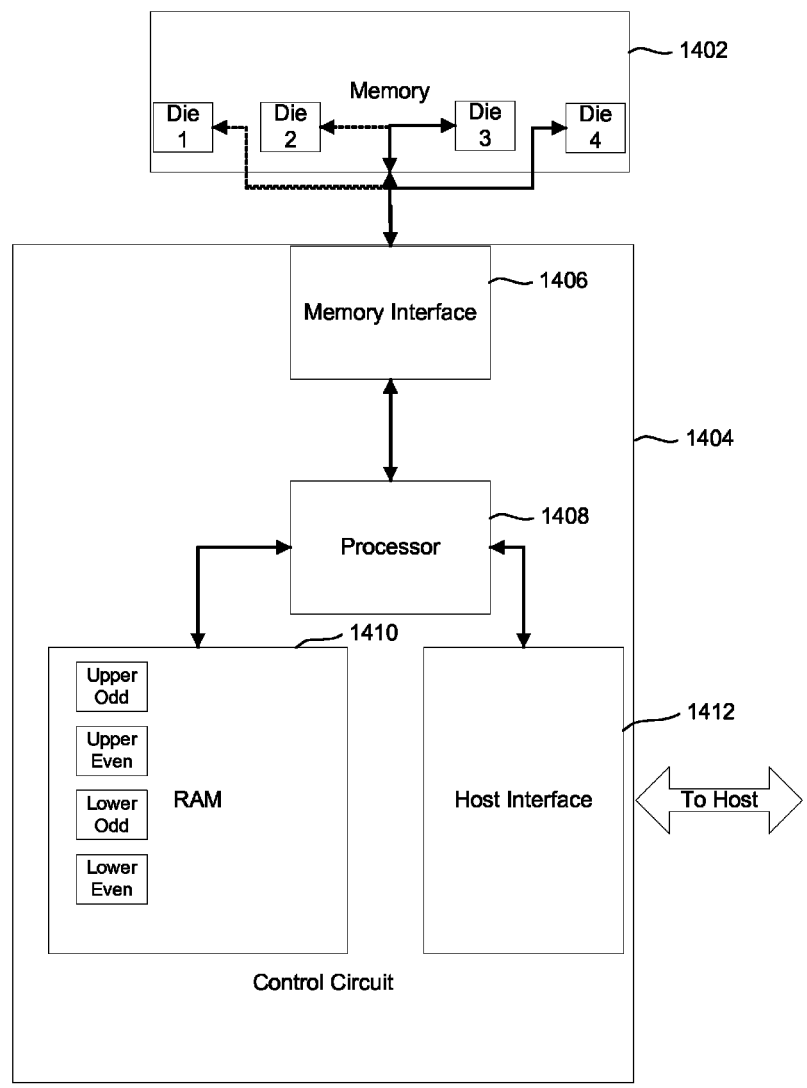
FIG. 14 is a block diagram depicting one embodiment of a system comprising a memory die, comprising multiple memory die and a controller circuit.

FIG. 14 depicts a memory system similar to that depicted in FIG. 13, except that the memory system (1402) is composed of multiple die (Die 1, Die 2, Die 3, Die 4), each with similar (or different) capacity and function to memory 1302. Although FIG. 14 shows four die, more or less than four die can be used. Control circuit 1404 includes Processor 1408 in communication with Memory Interface 1406, RAM 1410 and Host Interface 1412. In one embodiment, RAM 1410 comprises volatile memory. In another embodiment, RAM 1410 comprises non-volatile memory. Memory interface 1406 may be equipped with the ability to communicate with the individual die independently of the others, and the other components of controller 1404 (namely processor 1408, RAM 1410, and host interface 1412), may be modified in embodiments to handle and address the added capacity or functionality that results from multiple die. In particular, RAM 1410 includes a set of registers or memory locations that act as registers such that these registers can store discrete sets of data and pass this data to each other. FIG. 14 shows RAM 1410 with four registers (Upper Odd, Upper Even, Lower Odd and Lower Even); however, more than four registers or less than four registers can also be used.

Figure 15:
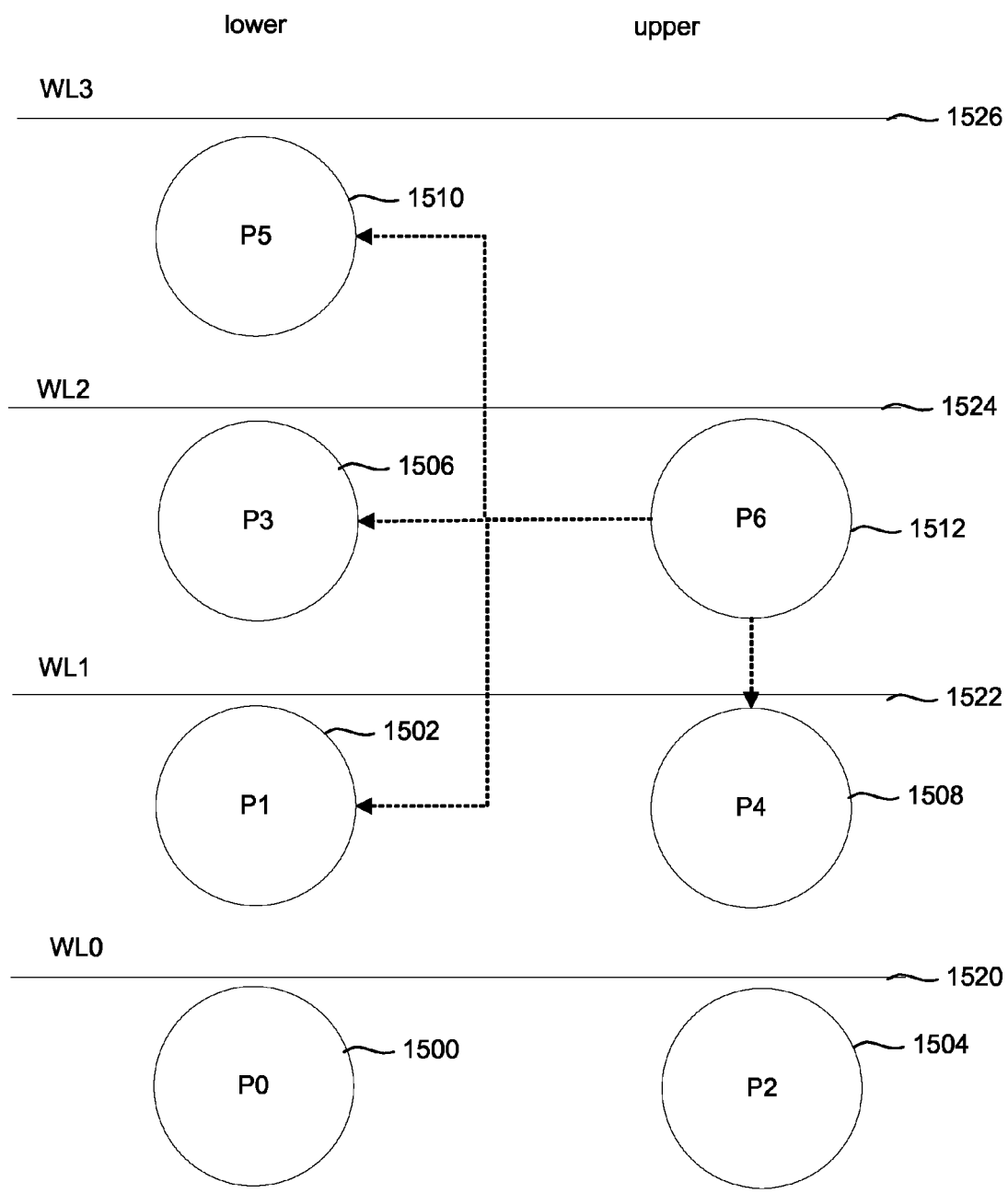
FIG. 15 is a diagram depicting an exemplary arrangement of data pages on a memory die with respect to each other and their respective word lines.

FIG. 15 depicts an exemplary layout of a subset of data pages on a memory die for a portion of one example block of memory cells. In this embodiment, each word line stores two pages of data. FIG. 15 shows four word lines (WL0 1520, WL1 1522, WL2 1524 and WL3 1526) from the block. The memory cells connected to word line 1520 store data in page P0 and page P2. The memory cells connected to word line 1522 store data in page P1 and page P4. The memory cells connected to word line 1524 store data in page P3 and page P6. The memory cells connected to word line 1526 store data in page P5 and page P8 (not depicted in FIG. 15). In one embodiment, the order of programming is P0, P1, P2, P3, P4, P5, P6, . . . .

To illustrate one example, assume that data is being programmed into page P6. The dotted lines with arrows in FIG. 15 show that pages P1, P3, P4 and P5 store nearby data on the same word line (1524) or proximate word lines (1522 and 1526). If there is a fault with word line 1524, programming page P6 could affect the data stored in the nearby pages P1, P3, P4 and P5. For example, if there is a short between word line 1524 and 1522, then programming P6 could effect P1 or P4 (and maybe P3). When programming P6, the data for P6 is stored in the latches (see data latches 494 of FIG. 5), so a failed programming process can be re-tried. However, if programming P6 damages the data in P1, P3, P4 or P5, that data could be lost.

Figure 16:
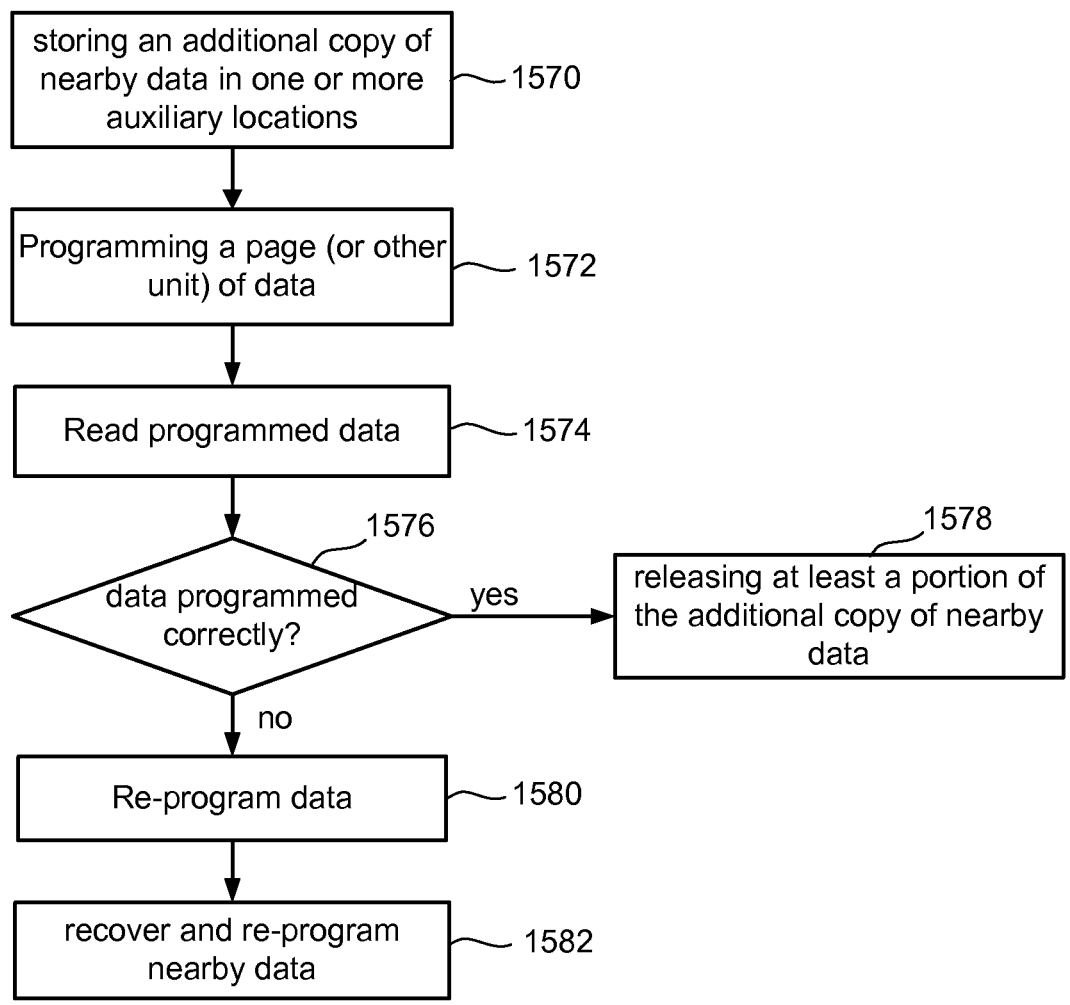
FIG. 16 is a flow chart depicting one embodiment of a method to preserve data located near a page while programming that page.

FIG. 16 is a flow chart describing one embodiment of a method for programming a page of data that will preserve data stored nearby the pages being programmed in case an error occurs. The process of FIG. 16 is performed (one or multiple times) as part of step 636 of FIG. 11. In one embodiment, the process of FIG. 16 is performed once for each page being programmed as part of a multi-page programming process. In step 1570, an additional copy of data nearby the target page being programmed is stored in one or more auxiliary locations. The auxiliary locations are different than the memory cells storing the data and different than the target of the current programming operation. For example, the auxiliary location can be data latches 494 of FIG. 5, RAM 1310 (or 1410), other locations off the memory die, one or more locations on the memory die or other memory cells. In step 1572, the data for the target page is programmed (e.g., using the process of FIG. 12). In order to program the data into the target page, the data is first loaded into an appropriate data latch 494 for the respective bit line, and then the data is programmed from the respective latch. In step 1574, the data in the target page that was just programmed is read back from the memory cells storing the target page. In step 1576, the data read back in step 1574 is compared to the original data in the latches 494. The read back can also be performed inside the NAND chip to judge if there is any error in between two state distributions for the pages that the original data is not kept. In some embodiments, due to latch limitations, only lower page data is kept; in other embodiments both low and upper pages are not kept in the data latches. If the data is determined to have been programmed correctly, then all or a portion of the nearby data stored in the auxiliary location is released (meaning that the auxiliary location is now free to discard or overwrite the data) in step 1578. If, in step 1576, the data is determined to have not been programmed correctly, then the system will re-program the data in a different block of memory cells in step 1580. Additionally, the target word line will be retired (marked so that it will no longer be used).

If the target page was corrupted, the system assumes a fault with the word line that affects the nearby data; therefore, the nearby data stored in the auxiliary location will be recovered and re-programmed to a different block of memory cells in step 1582. In some embodiments, if the target page is corrupted, the system assumes that nearby data is corrupted. In other embodiments, the system will test to determine if the nearby data is corrupted by comparing the data in the memory cells to the data in the auxiliary locations, and only corrupted data will be re-programmed. Additionally, the word lines storing nearby data that is corrupted will be retired (marked so that it will no longer be used).

In some embodiments of step 1576, data is programmed correctly if there are no errors. In other embodiments of step 1576, data is programmed correctly if the number of errors is less than a predetermined value, where the predetermined value is the number of bits that can be corrected by ECC or some fraction of the number of bits that can be corrected by ECC. If the ECC can correct the page, then this page can be determined to be programmed correctly. Another method to judge if the page is programmed correctly is discussed below with respect to FIG. 20.

In some embodiments, the nearby data store in one or more auxiliary locations comprises pages of data, and each page of nearby data is stored separately in the control circuit RAM (1310/1410). However, saving full pages of data in their own individual slots of control circuit RAM (1310/1410) may be an inefficient use of RAM space. Therefore, it may be more efficient (i.e., save memory space) to save units of data such as pages on locations in RAM 1310/1410 or the memory die by combining these units of data with data from other sources and storing this combined data in the same location. In some embodiments described herein, the system may store certain pages together in the same location by use of the bitwise XOR operation (or other mathematical or logical operation). That is, a single location on the RAM 1310/1410 (or memory die) may contain the result of the XOR operation on a collection of pages. In some embodiments, when copying data to store outside the block being programmed, the system may store lower pages (e.g., P0, P1, P3, and P5) together in one register while storing upper pages (e.g., P2, P4, and P6) together in one register. Alternatively, pages may be combined via the XOR operation into four registers (see FIG. 14): Upper Odd, Upper Even, Lower Odd and Lower Even. Upper pages on odd word lines (e.g. P4) are combined into the Upper Odd register. Upper pages on even word lines (e.g., P2 and P6) are combined into the Upper Even register. Lower pages on odd word lines (e.g., P1 and P5) are combined into the Lower Odd register. Lower pages on even word lines (e.g., P0 and P3) are combined into the Lower Even register. Using 4 XOR RAM buffer is due to the potential defect type in the memory, such as word line to word line short and the upper can damage lower pages in broken WL or WL to substrate short. Other arrangements can also be used. For example, when programming P6, the result of an XOR operation between P1 and P5 can be stored in the Lower Odd Register.

In order to retrieve a given page, the content of the register holding the combined data from the one or more XOR operations is XOR'd with all of the other pages stored therein. For example, if Lower Odd Register is storing P1 XOR P5, then in order to retrieve P1 the system will XOR the Lower Odd Register with P5.

Figure 17:
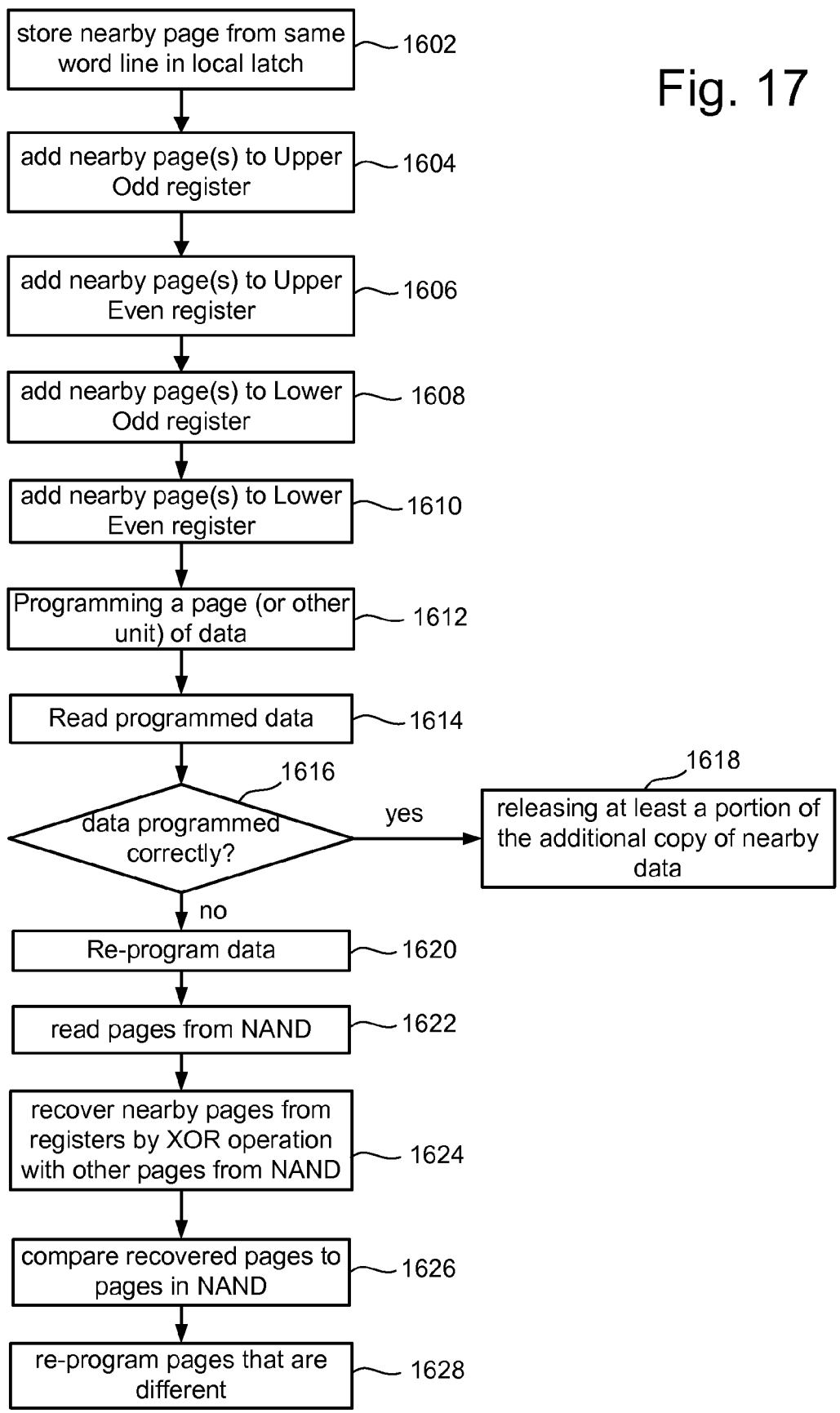
FIG. 17 is a flow chart depicting one embodiment of a method to preserve data located near a page while programming that page.

FIG. 17 is a flow chart describing an example implementation of the process of FIG. 16 covering one embodiment in which pages of data are combined, as explained above, in order to make more efficient use of storage space. The process of FIG. 17 is performed (one or multiple times) as part of step 636 of FIG. 11. In one embodiment, the process of FIG. 17 is performed once for each page being programmed as part of a multi-page programming process.

In step 1602, an additional copy of data nearby the target page being programmed and on the same word line as the target page being programmed is stored in a local latch on the memory chip (e.g., memory chip 212). In other embodiments, data nearby the target page being programmed and on the same word line as the target page being programmed is stored by combining using XOR as discussed below. In steps 1604-1610, an additional copy of data nearby the target page being programmed is stored in one or more auxiliary locations by combining pages of data using bitwise XOR operations (or another function to combine the data). The auxiliary locations are different than the memory cells storing the data and different than the target of the current programming operation. In one embodiment, the data nearby the target page being programmed is combined as discussed above. In step 1604, data nearby the target page being programmed that is stored in upper pages on odd word lines is stored in the Upper Odd Register by combining that nearby data with the content of the register using an XOR operation. In step 1606, data nearby the target page being programmed that is stored in upper pages on even word lines is stored in the Upper Even Register by combining that nearby data with the content of the register using an XOR operation. In step 1608, data nearby the target page being programmed that is stored in lower pages on odd word lines is stored in the Lower Odd Register by combining that nearby data with the content of the register using an XOR operation. In step 1610, data nearby the target page being programmed that is stored in lower pages on even word lines is stored in the Lower Even Register by combining that nearby data with the content of the register using an XOR operation.

In step 1612, the data for the target page is programmed (e.g., using the process of FIG. 12). In order to program the data into the target page, the data is first loaded into an appropriate data latch 494 for the respective bit line, and then the data is programmed from the respective latch. In step 1614, the data in the target page that was just programmed is read back from the memory cells storing the target page. In step 1616, the data read back in step 1614 is compared to the original data in the latches 494. If the data is determined to have been programmed correctly, then all or a portion of the nearby data stored in the auxiliary location is released (meaning that the auxiliary location is now free to discard or overwrite the data) in step 1618. In one embodiment, the entire contents of the registers are flushed. In another embodiment, the pages to be released are removed from the registers by reading the data from the memory cells for the pages to be released and performing a bitwise XOR operation to remove the data from the appropriate register.

In embodiments using XOR to keep the data on RAM, the XOR keeps accumulating data. In some embodiments, the system cannot release the data stored in the XOR accumulation. The system has to keep accumulate the XOR data, which is why the system keeps the table of FIG. 18 to make sure that it knows what data is being XORed together. After checking the current page is programmed correctly, the data is validated to be correct so the system can assume that it will be able to read back correctly later on. It cannot XOR data for very long time, since the table size is limited. By the time that the table is filled up, then the system will have to get rid of the table as well as the XOR data. This is done periodically depending on the size of the data. The failure on the boundary of flushing may not be protected.

If, in step 1616, the data is determined to have not been programmed correctly, then the system will re-program the data into a different block of memory cells in step 1620. Additionally, the target word line will be retired (marked so that it will no longer be used). In one embodiment, the data being programmed is also stored in the controller so that it can be sent to a new bock for programming in step 1620.

If the target page was corrupted, then the system will test to determine if the nearby data is corrupted by comparing the data in the memory cells to the data in the auxiliary locations, and corrupted data will be re-programmed. Additionally, the word lines storing nearby data that is corrupted will be retired (marked so that it will no longer be used). In step 1622, the data from the memory cells of nearby pages are read from the memory cells. Additionally, memory cells storing data that is combined in the registers are also read so that in step 1624 the date for the nearby pages are recovered from the registers and compared (in step 1626) to the data read in step 1622 to determine is the nearby data was corrupted. Pages that are different are assumed to be corrupted, and are re-programmed in step 1628. When the program data failure is detected some embodiments move all the data to a new block.

As described above, FIG. 14 shows a system with multiple die. In one embodiment, the system will perform the above-described processes separately for each of the die. In such an embodiment, RAM 1410 may have separate sets of registers for each die.

In another embodiment with multiple die, the system will combine the nearby pages being stored in auxiliary locations for all die into the same set (or sets) of registers. In one example, there is a single set of registers (Upper Odd, Upper Even, Lower Odd and Lower Even) used for all die.

Figures 18, 20:
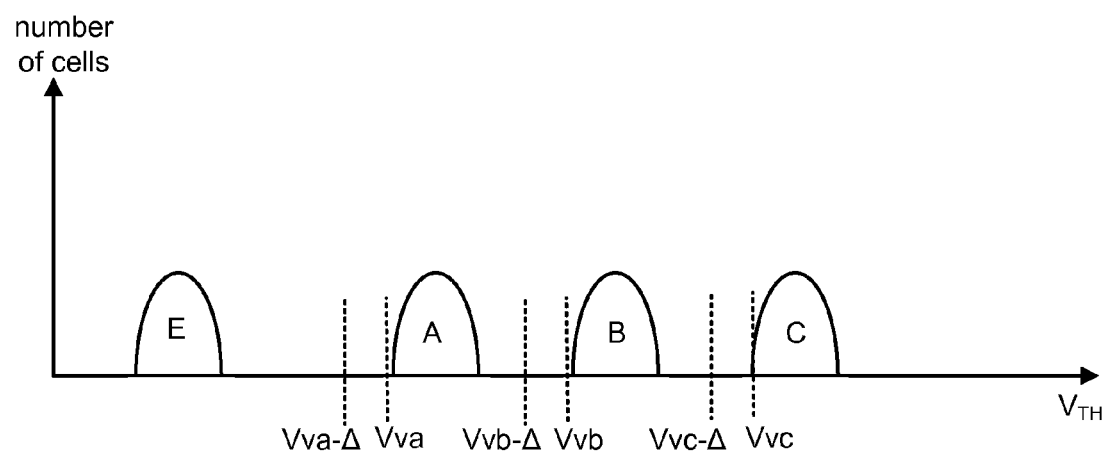
FIG. 18 depicts a table that keeps track of which pages of data are combined in a register.
FIG. 20 is a graph depicting threshold voltage regions in which memory cells are considered improperly programmed.

In another example embodiment, each block in a die will correspond to a block in the other dies in the system. In this manner, there can be set of registers (Upper Odd, Upper Even, Lower Odd and Lower Even) for block X of each die, or multiple blocks of each die. Alternatively, a table can be used to determine which pages or which blocks are represented in each register. FIG. 18 provides an example of a table that indicates which pages of data are combined into a register. In one example, there would be one table per register. The example table of FIG. 18 includes columns for table entry number, page number, block number, plane number and die number. Other table formats can also be used. In this manner, each register can store data "nearby data" for multiple die (or, alternatively, multiple blocks on the same die). The table of FIG. 18 will be maintained by the Controller.

Figure 19:
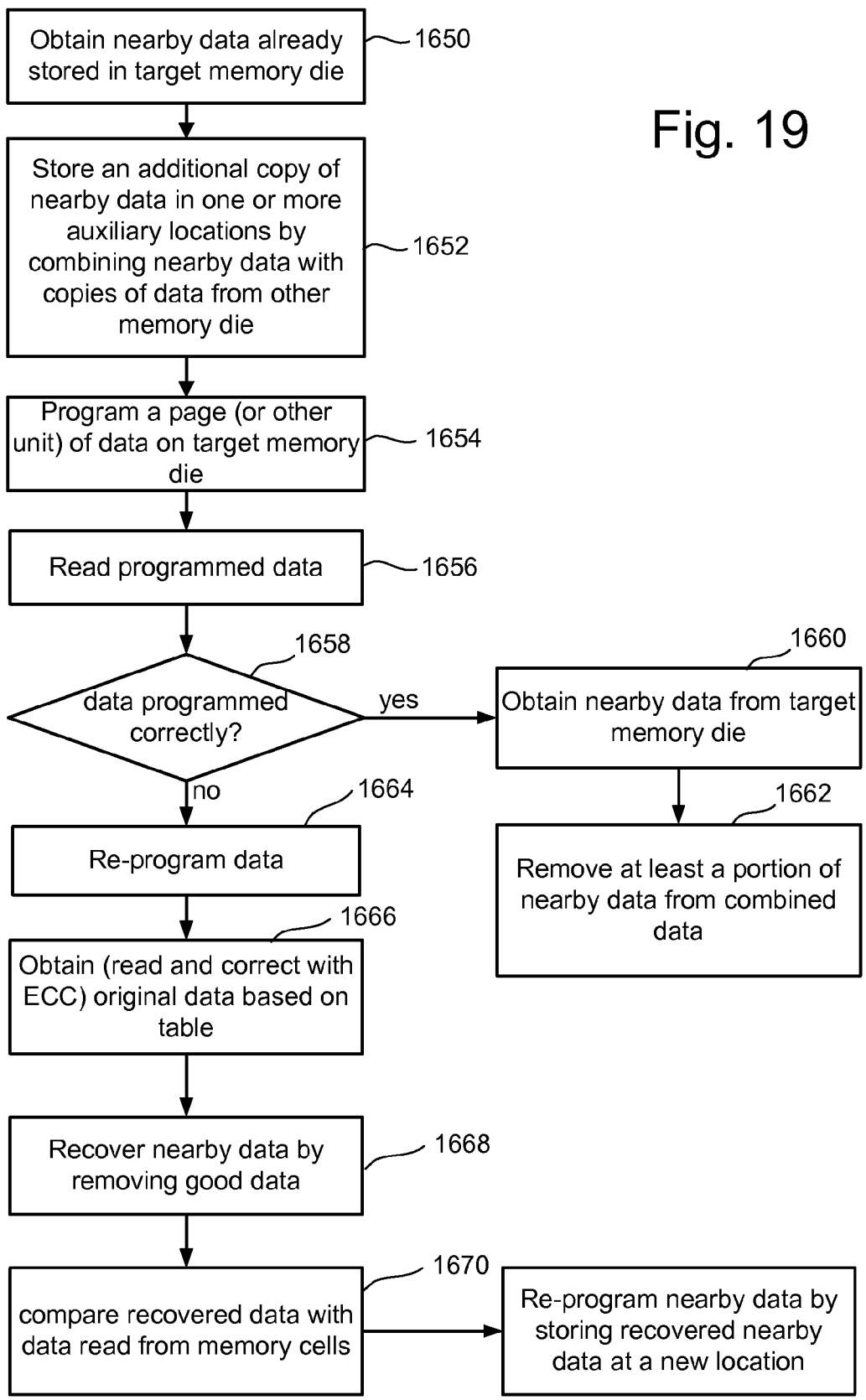
FIG. 19 is a flow chart depicting one embodiment of a method to preserve data located near a page on one memory die while programming that page by combining the nearby data with data from other memory die.

FIG. 19 is a flow chart depicting one embodiment of a method to preserve data located near a page on one memory die while programming that page by combining the nearby data with data from other memory die. This process presents an alternative to the process of FIG. 17, is another example implementation of the process of FIG. 16, and may be particularly useful when the memory system incorporates a plurality of memory die. In step 1650, the system obtains one or more pages (or other units) of data that are located near a target page (or other unit) of data in a target memory die. The system may use a standard read operation to obtain this data. In step 1652, this nearby data is copied in one or more auxiliary locations, combining this nearby data with data from other memory die using bitwise XOR operations (or another function). In one example implementation of step 1652, data nearby the target page being programmed that is stored in upper pages on odd word lines is stored in the Upper Odd Register by combining that nearby data with the content of the register using an XOR operation, data nearby the target page being programmed that is stored in upper pages on even word lines is stored in the Upper Even Register by combining that nearby data with the content of the register using an XOR operation, data nearby the target page being programmed that is stored in lower pages on odd word lines is stored in the Lower Odd Register by combining that nearby data with the content of the register using an XOR operation, and data nearby the target page being programmed that is stored in lower pages on even word lines is stored in the Lower Even Register by combining that nearby data with the content of the register using an XOR operation.

In step 1654, the system programs data into the target page of the target memory die. In step 1656, the system reads the data programmed in step 1654. In step 1658, the system determines whether this data has been successfully programmed. If the data has been programmed successfully, then the nearby data can be released from the auxiliary location. In step 1660, the system reads the nearby data (corresponding to the data stored in step 1652) form the memory cells. In step 1662, at least a portion of the nearby data that was stored in step 1652 is removed from the combined data in the registers using one or more XOR operations. In some embodiments, removing data from XOR pile is necessary only if the table in FIG. 18 does not exist. In one embodiment, it is preferred to leave the XOR pile there, just keep a table to keep track what goes into the XOR data holder If, in step 1658, the system has determined that the data programmed in step 1654 has not programmed correctly, then in step 1664, this data, possibly retrieved from data latches 494 or from the Controller, is re-programmed into a new location, such as another block in the same target memory die or in a block of another memory die. The nearby data may also need to be re-programmed. In step 1666, the system identifies which registers are storing the appropriate "nearby data." The tables (see FIG. 18) will be used to identify the all of the pages in the identified registers. The system will obtain the original data from the memory cells of all pages in the identified registers by reading the memory cells and performing error correction using the error correction codes. Using the XOR operation, they system will recover the nearby data from the registers (step 1668) and compare it to the data read from the memory cells storing nearby data (step 1670). If the nearby data read from the memory cells matches what was recovered from the register, then there was no corruption and the nearby data can optionally be reprogrammed. If the nearby data read from the memory cells does not matches what was recovered from the register, then there was corruption and the nearby data recovered from the register reprogrammed to a new location.

Since the XOR out process takes more time with more pages accumulated on to it, the address table and the registers will be periodically flushed out to re-start a new accumulation. As the page getting programmed, the defect detection is immediately after the program, hence there is no defect accumulation. As soon as one defect is detected, the data will be immediately recovered from the XOR page and all the related pages in the bad block may be moved to some other block.

There can also be embodiments where data is programmed for a partial page. In such an embodiment, a partial page can be combined into one of the registers mentioned above using an XOR operation for the first portion of the page. When additional portions of the page arrive, they can be added to the register by first performing an XOR operation with FF . . . and then XOR with the new data.

One method of determining whether or not a page of data has been successfully programmed, as performed by steps 1574 of FIG. 16, 1616 of FIGS. 17 and 1658 of FIG. 19 is to employ a standard read operation known in the art. However, in order to determine whether or not a page of data has been successfully programmed, other methods may be used as well. In one embodiment of the disclosed technology, determining whether or not a page of data has been successfully programmed comprises determining whether too many (with respect to some threshold) memory cells connected to the same word line are in ambiguous data states, such that the threshold voltages of these memory cells lie outside acceptable values for the possible data states. More details about this alternative method of determining whether or not memory cells have been programmed correctly are provided below with reference to FIGS. 20 and 21.

Figure 21:
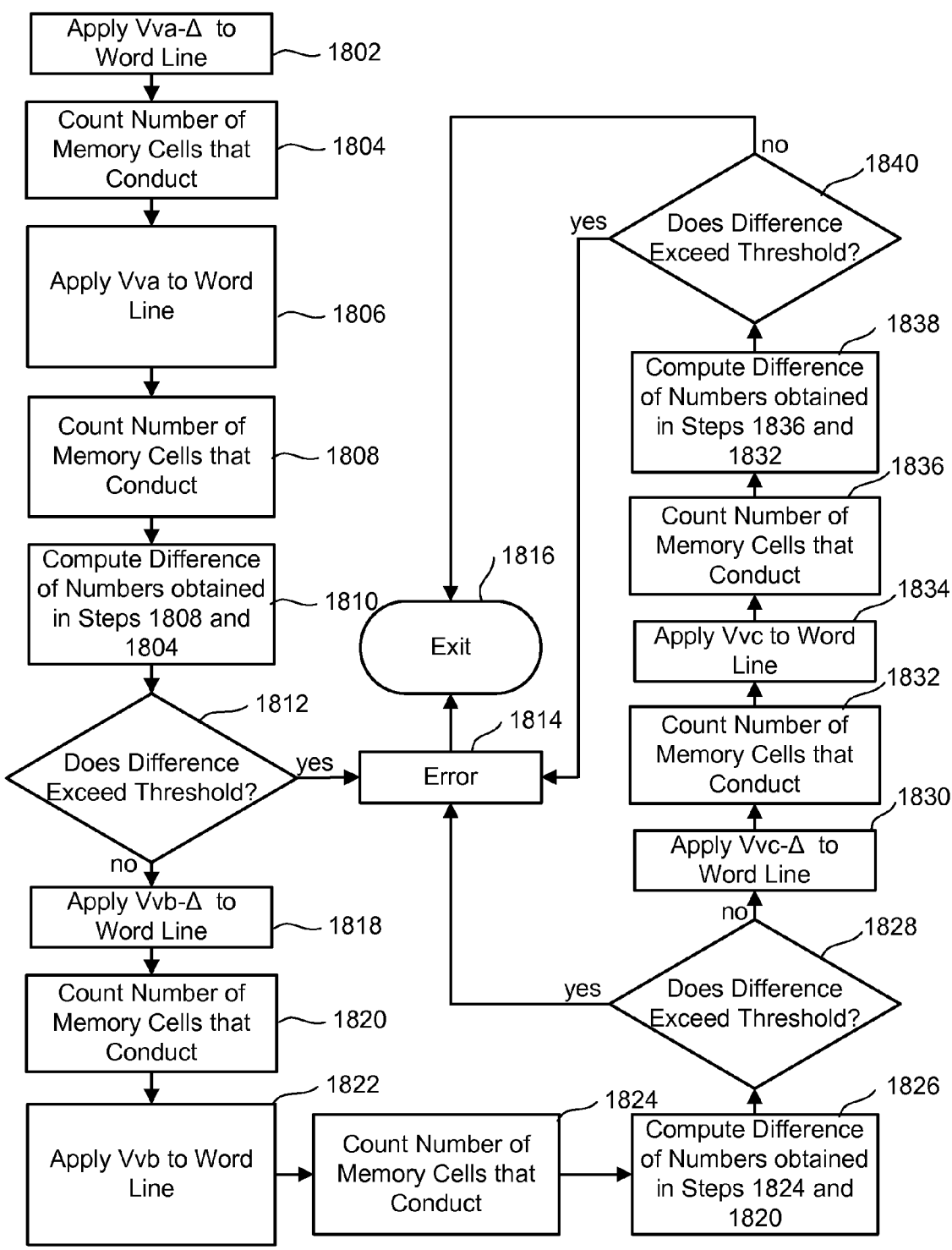
FIG. 21 is a flow chart depicting one embodiment of a method to determine whether too many memory cells in a set of memory cells have been improperly programmed.

FIG. 20 is a graph depicting threshold voltage regions in which memory cells are considered improperly programmed. This graph is similar to FIG. 6, and the process of determining the number of memory cells that are improperly programmed, with reference to the threshold voltage regions provided by FIG. 20, is depicted in FIG. 21. As in FIG. 6, the vertical axis of FIG. 20 represents the number of cells, whereas the horizontal axis represents threshold voltage. The graph depicts the distribution of memory cells with respect to threshold voltage, and regions of the distribution are labeled based on the data state these regions represent. While data states E, A, B, and C, corresponding to the data states of memory cells that store two bits of data, are depicted in FIG. 20, the concept illustrated in FIG. 20 may be extended to describe systems wherein the memory cells may store any number of bits of data.

In addition to the regions of the distribution of memory cells that represent data states, FIG. 20 also uses dotted lines to demarcate regions along the threshold voltage axis, in which, if memory cells lie, the system considers these memory cells improperly programmed. The first region of threshold voltages in which memory cells are considered improperly programmed is located between the dotted lines labeled 'Vva-Δ' and 'Vva,' respectively. The second region of threshold voltages in which memory cells are considered improperly programmed is located between the dotted lines labeled 'Vvb-Δ' and 'Vvb,' respectively. The third region of threshold voltages in which memory cells are considered improperly programmed is located between the dotted lines labeled 'Vvc-Δ' and 'Vvc,' respectively.

Whereas 'Vva', 'Vvb', and Wye refer to the verify reference voltages as described for FIG. 6, 'Vva-Δ,', 'Vvb-Δ,', and 'Vvc-Δ' may represent voltages less than 'Vva', 'Vvb', and 'Vvc', respectively, by the voltage value 'Δ'. In some embodiments, 'Δ' represents a constant voltage value, such as 0.2V. In other embodiments, 'Δ' is a voltage value that may vary among the regions of threshold voltages in which memory cells are considered improperly programmed. Thus, the regions of threshold voltages in which memory cells are considered improperly programmed are 'Δ' volts wide. Any memory cell whose threshold voltage lies in these regions is considered improperly programmed. For example, any memory cell whose threshold voltage lies between 'Vva-Δ' and 'Vva' has a threshold voltage between the threshold voltages that represent data states 'E' and 'A', but cannot be determined to be either in data state 'E' or data state 'A'. If enough memory cells in a set of memory cells (such as the memory cells connected to a wordline, or the memory cells in a block, etc.) are determined to be improperly programmed, the system may no longer use this set of memory cells in future programming or read operations. This set of memory cells may be referred to as "retired." In some embodiments, the memory die assigns each set of memory cells, such as word line or block, a flag bit whose state indicates whether that word line or block may be programmed and read normally, or whether it is likely damaged and invalid for further operations. Thus, once a set of memory cells has been 'retired', the region's corresponding flag bit may be flipped from its previous state to its opposite state ("1" to "0" or "0" to "1") to prevent further programming and read operations on the memory cells in this region. Alternatively, the information that determines whether a set of memory cells is retired or not retired may be stored in on-die address decoder 224 and/or controlled by state machine 222. The process of determining whether enough memory cells in a set of memory cells are improperly programmed, and in some cases, whether the set of memory cells must be retired, is described below with reference FIG. 21.

FIG. 21 is a flow chart depicting one embodiment of a method to determine whether too many memory cells in a set of memory cells have been improperly programmed. The method of FIG. 21 may be employed as an alternative to the standard read operation known in the art. In step 1802, the system applies voltage 'Vva-Δ' (as described by FIG. 20) to a word line while keeping the bit lines in the block of memory cells grounded. Then, in step 1804, the system counts the number of memory cells connected to the word line that conduct through their respective bit lines, thereby counting the number of memory cells whose threshold voltage is less than 'Vva-Δ'. The counting in step 1804 may be performed by processor 1308/1408 of control circuit 1304/1404. In step 1806, the system applies voltage 'Vva' to the same word line referred to in step 1802, while keeping the bit lines in the block of memory cells grounded. Then, in step 1808, in a manner similar to step 1804, the system counts the number of memory cells connected to the word line that conduct through their respective bit lines, thereby counting the number of memory cells whose threshold voltage is less than 'Vva'. Then, in step 1810, the system computes the difference between the numbers obtained in steps 1808 and 1804, thereby determining the number of memory cells whose threshold voltage lies between 'Vva-Δ' and 'Vva'. In some embodiments, this computation may be a subtraction operation performed by processor 1308/1408 of control circuit 1304/1404 on the numbers (stored in registers on processor 1308/1408) obtained by steps 1808 and 1804. As described by FIG. 20, these memory cells will be considered improperly programmed. Thus, in step 1812, the system (perhaps by using processor 1308/1408 of control circuit 1304/1404) may compare the number of memory cells that are considered improperly programmed to some threshold number. If the number of memory cells that are considered improperly programmed exceeds this threshold, then the system proceeds to step 1814, wherein the system may report an error. In some embodiments, the system may retire the word line. Then, the system proceeds to step 1816, in which the system exits the process. If the number of memory cells that are considered improperly programmed does not exceed this threshold, the system proceeds to step 1818.

Steps 1818-1826 proceed largely the same as steps 1802-1812, except that the system determines the number of memory cells whose threshold voltages lie between 'Vvb-Δ' and 'Vvb'. Then, in step 1828, similar to step 1812, the system checks whether the number of memory cells whose threshold voltages lie between 'Vvb-Δ' and 'Vvb' exceeds a threshold number, which may or may not be the same threshold number used in step 1812. In some embodiments, the system may instead add the number of memory cells whose threshold voltages lie between 'Vvb-Δ' and 'Vvb' to the number of memory cells whose threshold voltages lie between 'Vva-Δ' and 'Vva' and compare this new number to the threshold number. If the number of improperly programmed memory cells exceeds the threshold, then in step 1814, the system proceeds to steps 1814 and 1816 as before. Otherwise, the system proceeds to step 1830.

Steps 1830-1838 proceed largely the same as steps 1818-1826, except that the system determines the number of memory cells whose threshold voltages lie between 'Vvc-Δ' and 'Vvc'. Then, in step 1840, similar to step 1828, the system checks whether the number of memory cells whose threshold voltages lie between 'Vvc-Δ' and 'Vvc' exceeds a threshold number, which may or may not be the same threshold number used in steps 1812 and 1828. In some embodiments, the system may instead add the number of memory cells whose threshold voltages lie between 'Vvc-Δ' and 'Vvc' to the number of memory cells whose threshold voltages lie between 'Vvb-Δ' and 'Vvb' and/or the number of memory cells whose threshold voltages lie between 'Vva-Δ' and 'Vva', and then compare this new number to the threshold number. If the number of improperly programmed memory cells exceeds the threshold, then in step 1814, the system proceeds to steps 1814 and 1816 as before. Otherwise, the system proceeds directly to step 1816.

Figure 22:
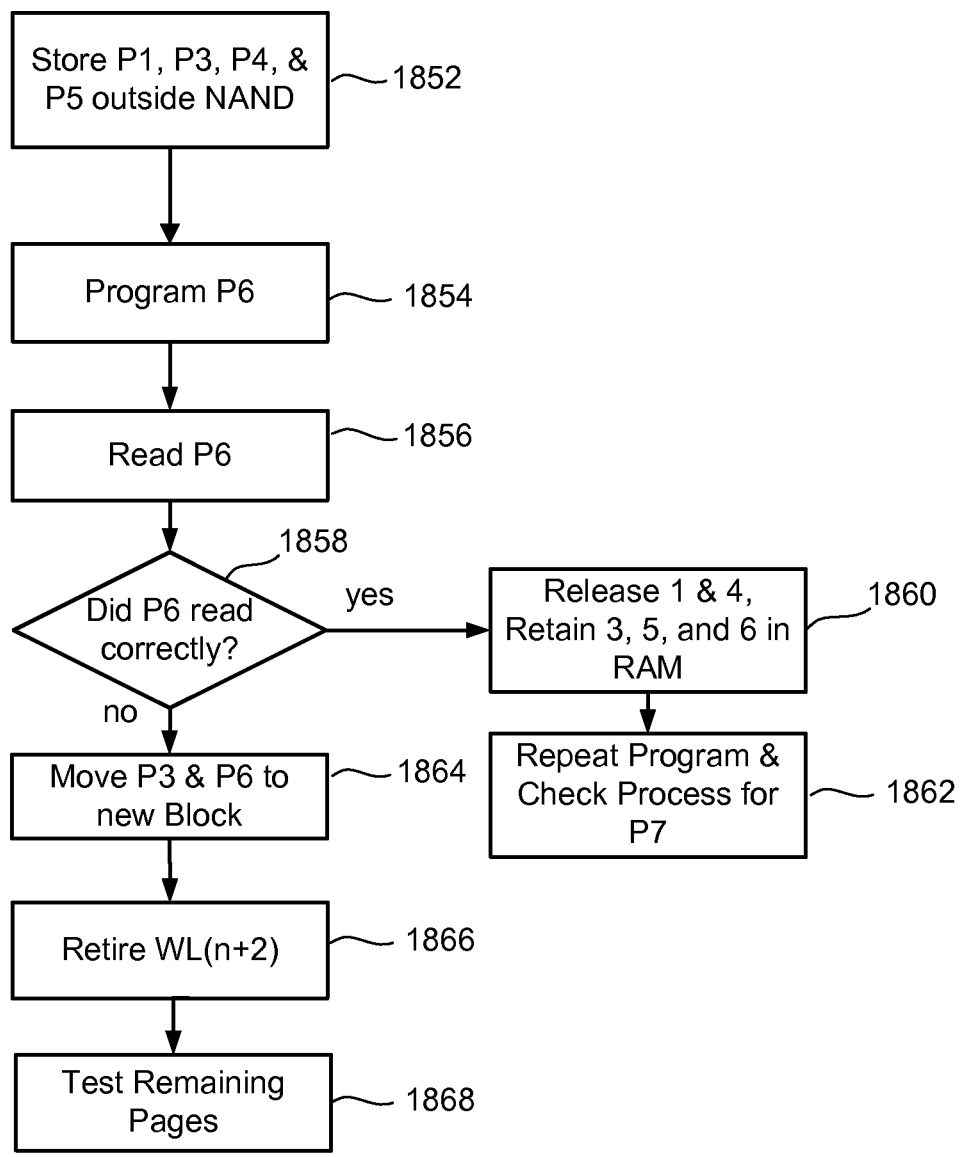
FIG. 22 is a flow chart depicting one embodiment of a method to preserve data located near a page while programming that page.

FIG. 22 is a flow chart that describes another of the process of FIG. 16 applied to the structure depicted in FIG. 15. Suppose the system is about to program P6 (1512 of FIG. 15). In step 1852, the system will store P1 (1502), P3 (1506), P4

(1508), and P5 (1510) in one or more auxiliary locations, since these are the pages nearby P6 (as they are on the same and proximate word lines), and thus the most likely to be corrupted by a programming operation on P6. In step 1854, the system programs the data into the memory cells for P6. In step 1856, the system reads the newly programmed data in page P6. In step 1858, the system checks whether this data was programmed correctly. In some embodiments, the system may use a multi-bit comparator, perhaps located in processor 1308/1408, memory interface 1306/1406 of one or more control circuit's 1304/1404, a dedicated counter on the memory die or the state machine 222 (see FIG. 3) in order to determine whether the data just programmed onto P6 matches a copy of that data stored in the latches 494 prior to programming P6. In some embodiments, this copy may also be located on RAM 1310/1410 on the controller.

If, in step 1858, the system determines that the programming operation on P6 has succeeded, then in step 1860 the system releases P1 and P4 from storage at the auxiliary location while retaining the copies of P3, P5, and P6 that it had stored earlier, since those pages are physically proximate to P7 (not pictured), which, in step 1862, is programmed using the process of FIG. 22.

If, in step 1858, the system determines that the programming operation on P6 has failed, then in step 1864, the system treats the contents of both P6 and P3 as corrupted, since they are on the same word line (1524). In some embodiments of step 1858, the system may test P3 instead of P6, or may test both P3 and P6, responding the same way if either read should fail. In step 1864, the system moves the stored copies of P6 and P3 by programming this recovered data to a new block of non-volatile storage elements on the memory die. Then, in step 1866, the corrupted word line, WL(n+2), is retired. In some embodiments, the memory die assigns each word line and block a flag bit whose state indicates whether that word line or block may be programmed and read normally, or whether it is likely corrupted and invalid for further operations. Thus, for their corresponding pages (in this case, P3, and P6), these bits may be flipped from its previous state to its opposite state ("1" to "0" or "0" to "1") to prevent further programming and read operations on these pages. Alternatively, the information that determines whether a word line or block is active or retired may be stored in on-die address decoder 224 and/or controlled by state machine 222.

As described above, the error in the read of P6 may have resulted from the word line to word line short. Therefore, in step 1868, the system proceeds to test whether the remaining nearby pages P1, P4, or P5 have been corrupted as well. More details of step 1868 are provided in FIG. 23.

Figure 23:
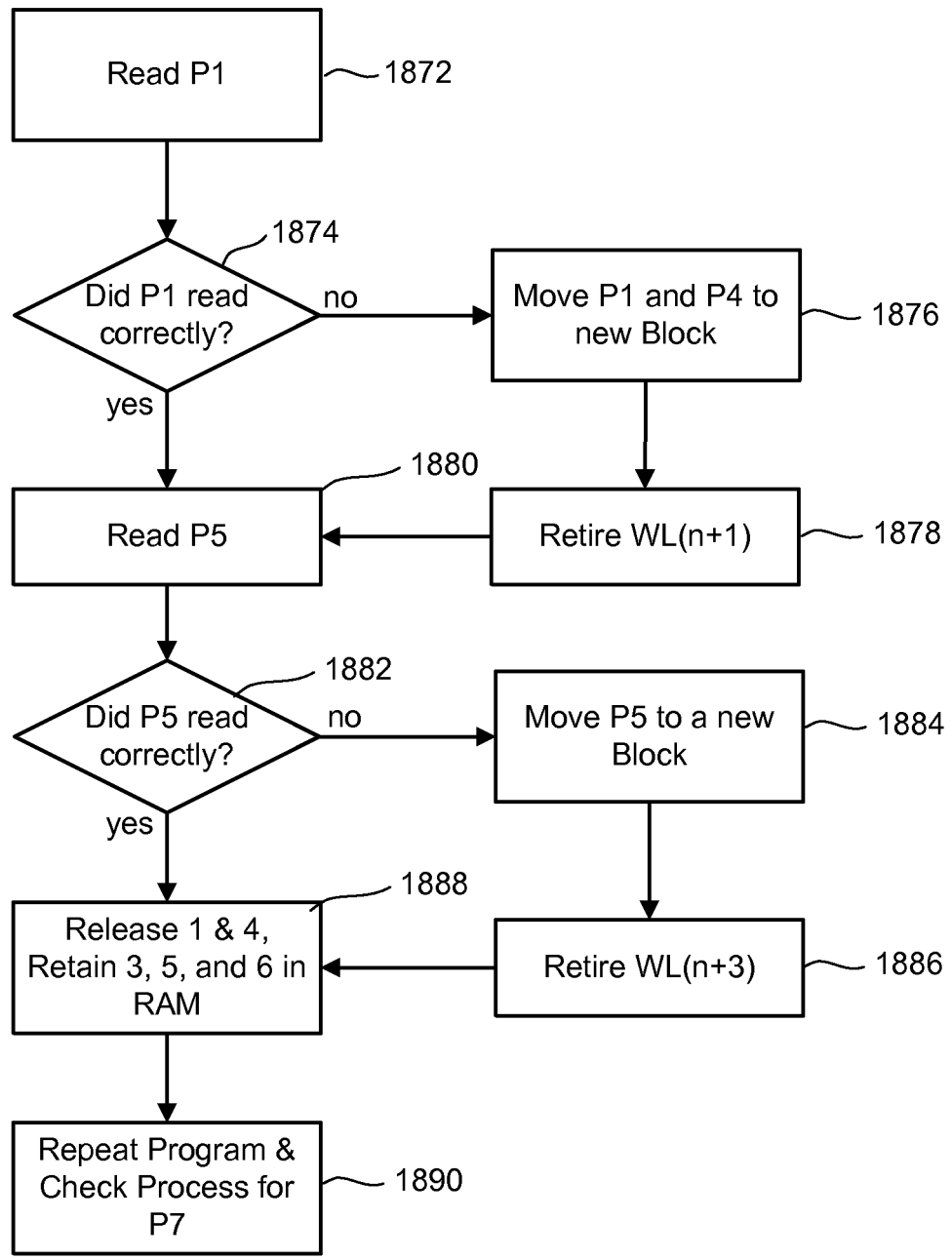
FIG. 23 is a flow chart depicting one embodiment of a method to preserve data near a page that is to be programmed.

FIG. 23 is a flow chart describing a process for testing the nearby pages after programming a target page. In step 1872, the system reads P1 to ensure that it has not been corrupted (e.g., by a word line to word line short). Thus, in some embodiments of step 1872, the system may read P4, since it is also on the same word line, or the system may read both P1 and P4. In step 1874, the system may check to determine if P1 (or P4, or both P1 and P4) reads correctly by matching it to the copy of the page stored in the auxiliary location. If the read is successful, the system transitions to step 1880 to read P5 in order to determine whether it may have been corrupted by a word line to word line short between WL(n+2) and WL(n+3).

If the read of step 1874 is not successful, then the system transitions to step 1876. Similar to step 1614 of FIG. 16, in step 1876 the system moves the copies of P1 and P4 that were stored as backup to a new block on the NAND memory. Then, in step 1878, the system retires WL(n+1), as it has likely been corrupted by a short with WL(n+2). The system then transitions to step 1880, wherein the system reads P5. In step 1882, the system checks whether the read of P5 in step 1880 was successful. If P5 read successfully, then the system moves to step 1888, in which, the system releases its copies of P1 and P4 while keeping its copies of P3, P5, and P6. Next, in step 1890, the system repeats processes similar to those described for FIGS. 16 and 17A while programming P7 (not pictured).

If the read of P5 is not successful in step 1880, the system moves its copy of P5 to a new block on the NAND (step 1884) while retiring WL(n+3) in step 1886. The system then executes step 1888 followed by step 1890.

Looking back at FIG. 15, each word line has a lower page and an upper page. For example, P0. P1, P3 and P5 are lower pages. P2, P4 and P6 are upper pages.

Figure 24:
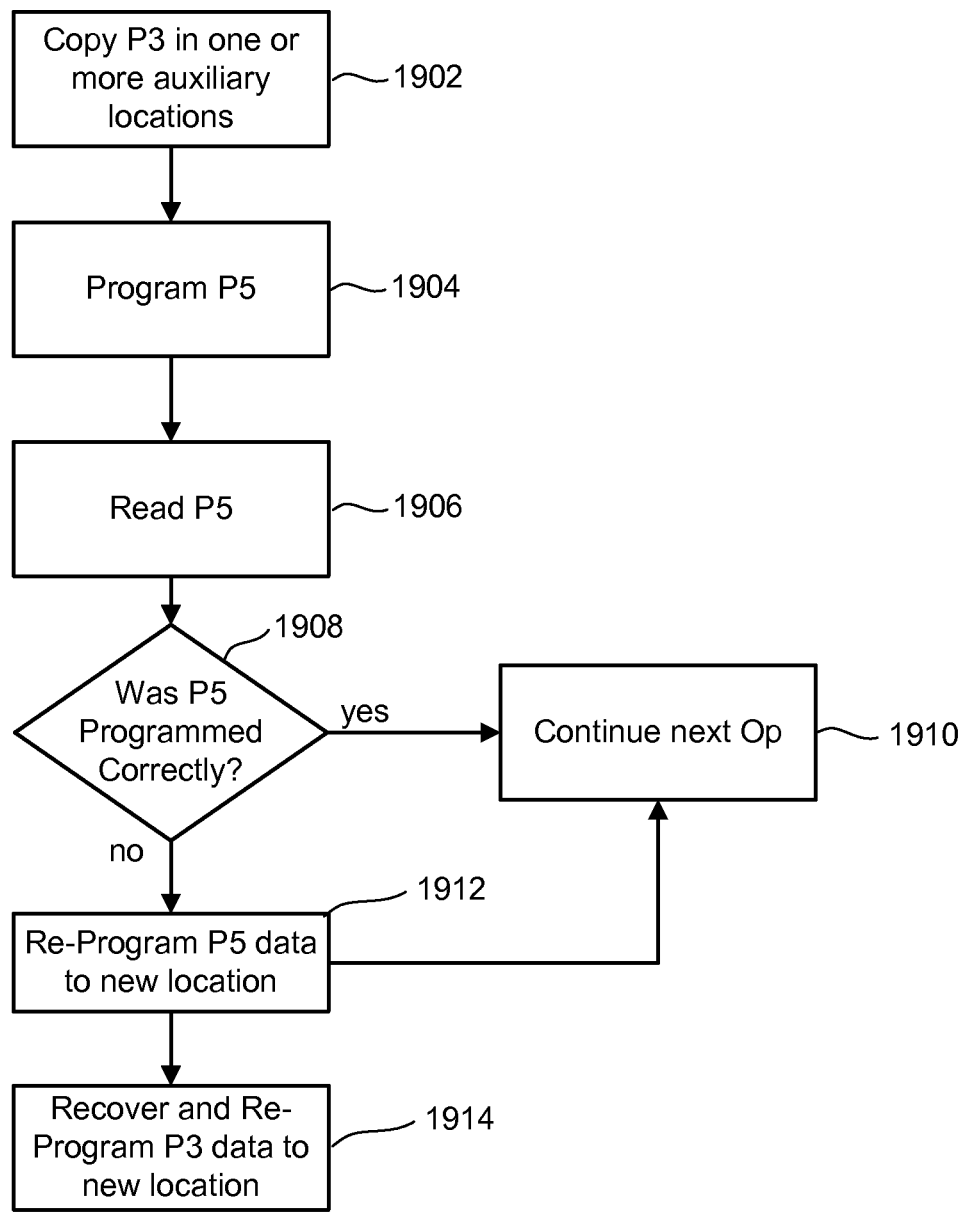
FIG. 24 is a flow chart depicting one embodiment of a method to preserve data located near a lower page while programming that page during an ordered sequence of programming operations.

FIG. 24 is a flow chart depicting one embodiment of a method to preserve data located near a lower page while programming that lower page during an ordered sequence of programming operations. The process of FIG. 24 may be employed as an alternative to those depicted in FIGS. 16 and 22. In step 1902, as in step 1570 of FIG. 16, an additional copy of a data page nearby the target lower page being programmed is stored in one or more auxiliary locations. In one embodiment, the auxiliary locations may comprise one or more locations in RAM 1310/1410 of control circuit 1304/1404. This nearby data page will be referred to herein as P3, and the target lower page will be referred to herein as P5, with reference to FIG. 15, but the process of FIG. 24 can be adapted to any page or word line architecture. Thus, in step 1904, the system programs P5. Then, after the programming operation of step 1904, the system reads P5. In step 1908, the system checks whether P5 was programmed correctly. If P5 was programmed correctly, the system proceeds to step 1910, in which the system continues onto the next operation. Otherwise, the system proceeds to step 1912.

In step 1912, the system re-programs the data that was programmed onto P5 to a new location. In some embodiments, the system may retrieve this data from data latches 494 (FIG. 5) and program this data to an alternative location on the memory die. Then, because P3 may have been corrupted by a word line to word line short between WL3 and WL2, in step 1914, the system recovers the data that was programmed onto P3 from the one or more auxiliary locations to which this data was copied in step 1902. The system then proceeds to program this data to a new location before continuing onto the next operation in step 1910.

Figure 25:
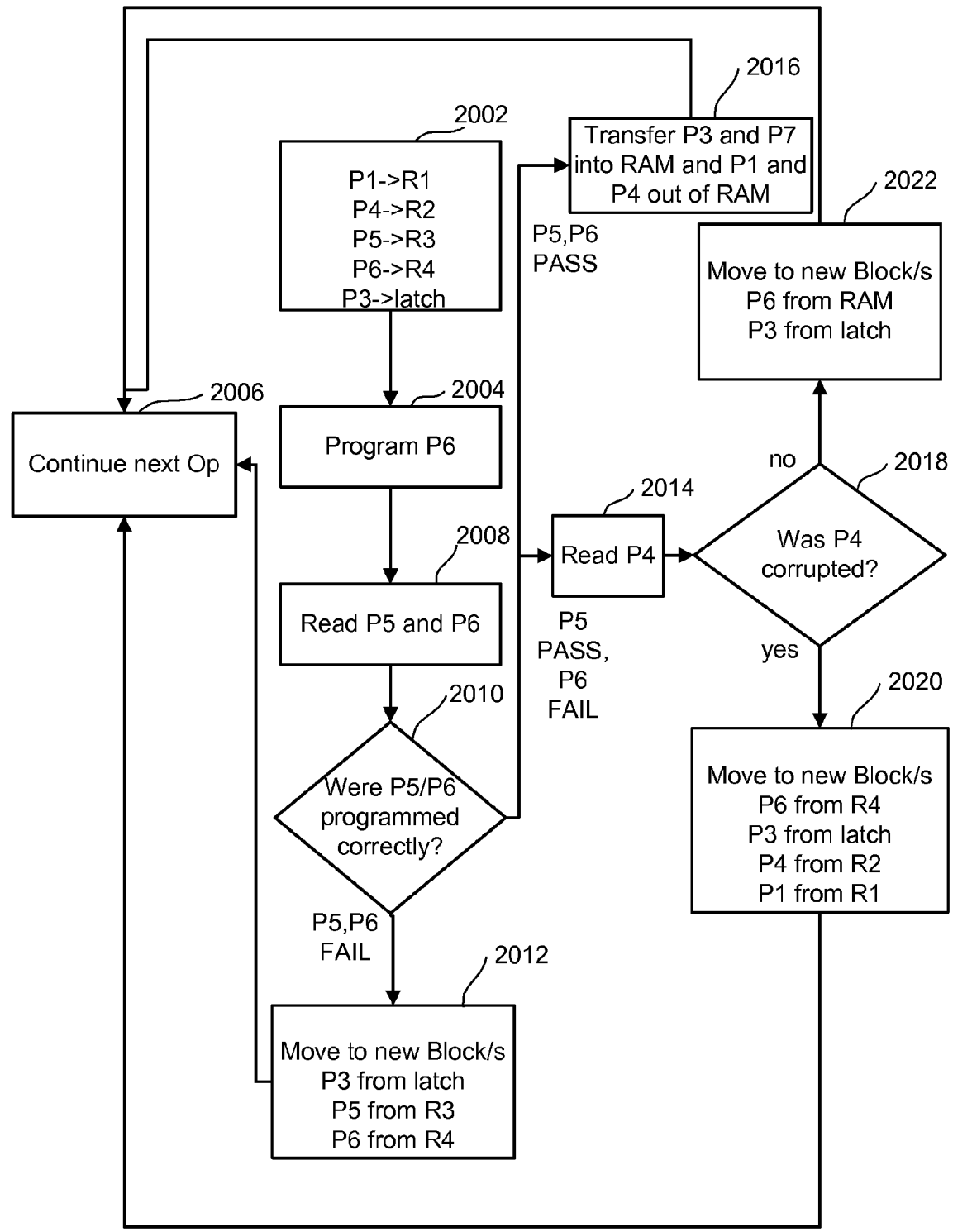
FIG. 25 is a flow chart depicting one embodiment of a method to preserve data located near an upper page while programming that upper page during an ordered sequence of ordered programming operations.

FIG. 25 is a flow chart depicting one embodiment of a method to preserve data located near an upper page while programming that upper page during an ordered sequence of programming operations. The process of FIG. 25 may be employed as an alternative to those depicted in FIGS. 16 and 22. In step 2002, data pages nearby a target upper page to be programmed are stored in one or more auxiliary locations. With reference to FIG. 15, in some embodiments, the target upper page may comprise P6 and these nearby data pages may comprise P1, P4, and P5. With reference to FIGS. 13 and 14, in some embodiments, these auxiliary locations may comprise registers R1, R2, and R3 in RAM 1310/1410, such that P1, P4, and P5 are stored on R1, R2, and R3 respectively. In some embodiments, a copy of the data to be programmed on P6 may also be stored in an auxiliary location, such as register R4 in RAM 1310/1410. Additionally, some data nearby P6, such as the data on P3 (again referring to FIG. 15) may need to be stored in one or auxiliary locations other than RAM 1310/1410, in order to reduce the necessity of extra RAM and thereby conserve valuable die area. Thus, in some embodiments, the system retains a copy of the P3 data on data latches 494 (FIG. 5). In some cases, because the programming operations are progressing in an ordered sequence, the P3 data may already be stored in data latches 494 prior to step 2002. While FIG. 25 makes specific reference to other figures, the process of FIG. 25 can be adapted to any page, RAM, or word line architecture.

In step 2004, the system programs P6. Once P6 has been programmed, then in step 2008, the system reads P5 and P6. Then, in step 2010, the system checks whether P5 and P6 have been programmed correctly. If both P5 and P6 have been programmed successfully, then in step 2016, the system moves the P3 data to register R1 on RAM 1310/1410, since it is nearby P7 (not pictured), which may be programmed after P6, and the data on P3 may be corrupted by programming P7 in case of a physical defect. Meanwhile, the system removes the copies of P1 and P4 from RAM 1310/1410, since P1 and P4 are not likely to be corrupted when the system programs P7, and removing the copies of P1 and P4 prevents accumulation of large quantities of data in RAM 1310/1410 and reduces the necessity of extra RAM, thereby conserving valuable die area. Additionally, the copy of P6 may be transferred from R4 to R3, the copy of P5 may be transferred from R5 to R2, and a copy of the data to be programmed into P7 is stored in R4 in case the programming of P7 fails. After step 2016, the system continues onto the next operation in step 2006.

In some embodiments, the system may read P6 before reading P5, such that if P6 was programmed successfully, the system immediately transitions to step 2006.

After step 2010, if both P5 and P6 were not programmed correctly, then it is likely that P3 was also corrupted due to a word line to word line short between WL3 and WL2. Therefore, in step 2012, the copies of P3, P5, and P6 from the data latch, R3, and R4 respectively are moved to one or more new blocks of data. Then, the system proceeds to step 2006.

If P5 was programmed successfully, but P6 was not programmed successfully, then P1 and P4 may also have been corrupted via a word line to word line short between WL2 and WL1. Thus, in step 2014, the system reads P4. In some embodiments, the system may instead read P1, or read P1 in addition to P4. In step 2018, the system checks whether P4 (or P1) was corrupted. If P4 (or P1) was not corrupted, then in step 2020, the copies of P1, P4, P6, and P3 from R1, R2, R4, and the data latch respectively are moved to one or more new blocks of data. Then, the system proceeds to step 2006.

If P4 (or P1) was not corrupted, then the physical defect, such as a broken word line, was likely isolated to WL2. Thus, in step 2022, the copies of P6 and P3 from the R4 and the data latch respectively are moved to one or more new blocks of data. After step 2022, the system proceeds to step 2006.

Figure 26:
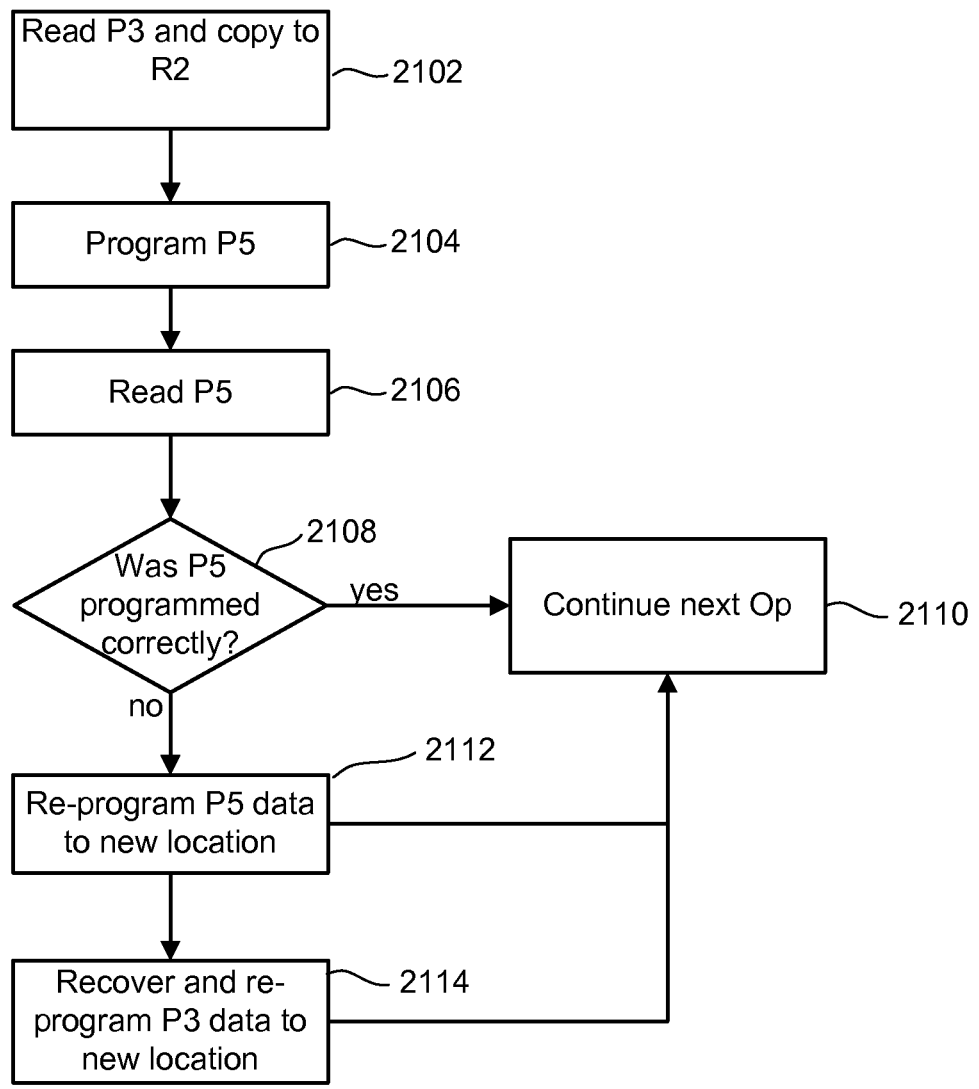
FIG. 26 is a flow chart depicting one embodiment of a method to preserve data located near a lower page while programming that page during a random sequence of programming operations.

FIG. 26 is a flow chart depicting one embodiment of a method to preserve data located near a lower page while programming that lower page during a random sequence of programming operations (i.e. not in order P0, P1, P2, . . . ). FIG. 26 depicts an alternative process to that depicted in FIG. 24. With reference to FIG. 15, the target data page to be programmed will be referred to as P5, and the nearby data page will be referred to as P3. Since the programming operations have been proceeding in a random order, there may not be a copy of P3 in data latches 494. Thus, in step 2102, the system reads P3, copying this data to one or more auxiliary locations. In one embodiment, an auxiliary location may be register R2 in RAM 1310/1410. Then, in step 2104, the system programs P5. In step 2106, the system reads P5. In step 2108, the system checks whether P5 has been programmed correctly. If P5 was programmed correctly, the system continues onto the next operation in step 2110. Otherwise, the system proceeds to step 2112, in which the system retrieves the data that was supposed to be programmed onto P5, perhaps from data latches 494, and re-programs this data to a new location. Since the programming operation in step 2108 may have corrupted P3, in step 2114, the system recovers the P3 data copied in step 2102 and re-programs this data to a new location. The system then proceeds to step 2110.

Figure 27:
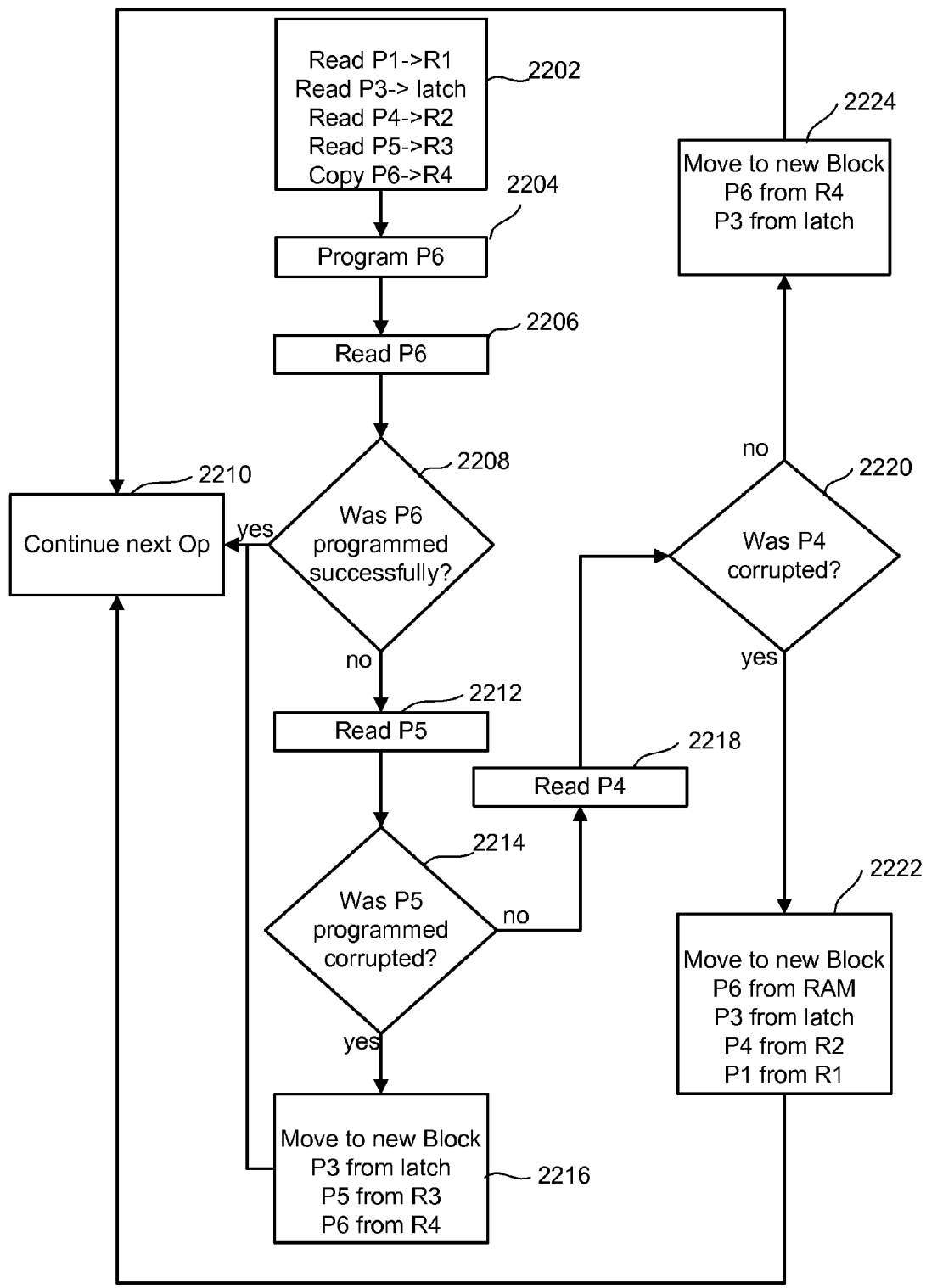
FIG. 27 is a flow chart depicting one embodiment of a method to preserve data located near an upper page while programming that upper page during a random sequence of programming operations.

FIG. 27 is a flow chart depicting one embodiment of a method to preserve data located near an upper page while programming that upper page during a random sequence of programming operations. The process of FIG. 27 may be employed as an alternative to that depicted in FIG. 25. In step 2202, data pages nearby a target upper page to be programmed are stored in one or more auxiliary locations. With reference to FIG. 15, in some embodiments, the target upper page may comprise P6 and these nearby data pages may comprise P1, P4, and P5, which the system may have to obtain by performing standard read operations since the programming operations have been proceeding in a random order, there may not be copies of these data pages in data latches 494. With reference to FIGS. 13 and 14, in some embodiments, the auxiliary locations may comprise registers R1, R2, and R3 in RAM 1310/1410, such that P1, P4, and P5 are stored in R1, R2, and R3 respectively. In some embodiments, a copy of the data to be programmed on P6 may also be stored in an auxiliary location, such as register R4 in RAM 1310/1410. Additionally, some data nearby P6, such as the data on P3 (again referring to FIG. 15) may need to be stored in one or auxiliary locations other than RAM 1310/1410, in order to reduce the necessity of extra RAM and thereby conserve valuable die area. Since the programming operations have been proceeding in a random order, there may not be a copy of P3 in data latches 494. Thus, in step 2202, the system also reads P3, copying this data to one or more of the data latches 494. While FIG. 27 makes specific reference to other figures, the process of FIG. 27 can be adapted to any page, RAM, or word line architecture.

In step 2204, the system programs P6. Once P6 has been programmed, then in step 2206, the system reads P6. Then, in step 2208, the system checks, based on the read operation of step 2206, whether P6 has been programmed correctly. If P6 has been programmed successfully, then in step 2210, the system continues onto the next operation.

If P6 has not been programmed correctly, then in step 2212, the system reads P5 in order to determine whether or not P5 was corrupted by the programming operation of step 2204, perhaps by a word line to word line short between WL2 and WL3. In step 2214, the system checks whether or not P5 was corrupted. If P5 was corrupted, then in step 2216, the system moves the copies of data corresponding to P3, P5, and P6 from one of the data latches 494, R3, and R4 respectively (saved in step 2202) to a new location, such as a new block on the memory die. Then, the system continues onto the next operation in step 2210.

If P5 was not corrupted, then but P6 was not programmed successfully, then P1 and P4 may also have been corrupted via a word line to word line short between WL2 and WL1. Thus, in step 2218, the system reads P4. In some embodiments, the system may instead read P1, or read P1 in addition to P4. In step 2018, the system checks whether P4 (or P1) was corrupted. If P4 (or P1) was corrupted, then in step 2224, the copies of P1, P4, P6, and P3 from R1, R2, R4, and the data latch respectively are moved to a new location such as one or more new blocks of data. Then, the system proceeds to step 2210.

If P4 (or P1) was not corrupted, then the physical defect, such as a broken word line, was likely isolated to WL2. Thus, in step 2222, the copies of P6 and P3 from the R4 and the data latch respectively are moved to a new location such as one or more new blocks of data. After step 2222, the system proceeds to step 2210. In some embodiments, after step 2208, if P6 was not programmed successfully, the system may directly proceed to step 2216 or step 2222 rather than read individual surrounding pages and decide which pages should be moved to a new location.

This disclosure describes a system and methods for securing data to be programmed on non-volatile memory devices, such as NAND memory die. Data which is programmed onto these non-volatile memory elements may be subject to corruption from broken word lines or short-circuits between word lines. Therefore, the present technology may be employed to detect if such a failure may have occurred by checking whether the stored data differs from one or more stored copies or whether the memory elements lie in ambiguous voltage states. If, for example, a data page has failed to program correctly, then this page and/or one or more nearby pages are moved (via safe copies) to alternative blocks on the memory circuit. In some embodiments, the copies of the programmed pages lie on RAM that is a part of the controller circuit connected to the memory die. In other embodiments, the copies are combined via the XOR operation into an equal or lower number of pages, stored according to word line and page location. Further embodiments of the disclosed technology can apply the XOR scheme to combine pages across multiple die in the NAND or the RAM, thus allowing the system to preserve data while conducting a sequence of programming operations across these multiple memory die.

One embodiment comprises a process for programming non-volatile storage, comprising programming a first set of data into a first set of non-volatile storage elements; prior to the programming of the first set of data, storing an additional copy of nearby data in one or more auxiliary locations that are different from intended non-volatile storage elements in the non-volatile storage for the nearby data, the nearby data is stored on proximate word lines with respect to the first set of non-volatile storage elements. The process further comprises determining whether the first set of data was programmed correctly, if the first set of data was programmed correctly, releasing at least a portion of the additional copy of nearby data, and if the first set of data was not programmed correctly, re-programming the first set of data to non-volatile storage elements different than the first set of non-volatile storage elements and recovering at least a portion of the nearby data from the additional copy and programming the recovered nearby data to additional non-volatile storage elements that are different than the intended non-volatile storage elements.

One embodiment comprises a non-volatile storage system, comprising a plurality of non-volatile storage elements and one or more control circuits in communication with the non-volatile storage elements. The one or more control circuits program multiple sets of data into the non-volatile storage elements. For each set of the data programmed, the one or more control circuits store an additional copy of nearby data in one or more auxiliary locations that are different from intended non-volatile storage elements prior to programming the respective set of data, determine whether the respective set of data was programmed properly, recover at least a portion of the nearby data from the additional copy and program the recovered nearby data to additional non-volatile storage elements that are different than the intended non-volatile storage elements if the respective set of data was not programmed properly.

One embodiment comprises a process for programming non-volatile storage, comprising programming multiple sets of data into non-volatile storage. For each set of the data being program, the process further comprises storing an additional copy of nearby data in one or more auxiliary locations that are different from intended non-volatile storage elements prior to programming the respective set of data, determining whether the respective set of data was programmed properly, releasing at least a subset of the additional copy of the nearby data that is not proximate to other sets of data to be programmed and storing an additional copy of other data nearby to another set of data to be programmed if the respective set of data was programmed properly, and recovering at least a portion of the nearby data from the additional copy and programming the recovered nearby data to additional non-volatile storage elements that are different than the intended non-volatile storage elements if the respective set of data was not programmed properly.

One embodiment comprises a process for programming non-volatile storage, comprising programming a first set of data to different memory die, and for each set of data, obtaining a copy of nearby data already stored in intended non-volatile storage elements, combining the obtained copy of the nearby data with copies of data from other memory die, and if the respective set of data does not program properly, then recovering at least a portion of the nearby data from the combined copy of the nearby data with copies of the data from other memory die and storing the recovered nearby data at a new location.

One embodiment comprises a process for programming non-volatile storage, comprising: programming multiple sets of data to different memory die and for each set of data: obtaining a copy of nearby data already stored in intended non-volatile storage elements, combining the obtained copy of the nearby data with copies of data from other memory die, if the respective set of data does not program properly then recovering at least a portion of the nearby data from the combined copy of the nearby data with copies of the data from other memory die and storing the recovered nearby data at a new location.

One embodiment comprises a non-volatile storage system, comprising a plurality of memory die, each of the memory die including multiple non-volatile storage elements, and one or more control circuits in communication with the non-volatile storage elements. The one or more control circuits program multiple sets of data to different memory die. For each set of data, the one or more control circuits obtain a copy of nearby data already stored in intended non-volatile storage elements, combine the obtained copy of the nearby data with copies of data from other memory die, and, if the set of data does not program properly, then the one or more control circuits recover at least a portion of the nearby data from the combined copy of the nearby data with copies of the data from other memory die and store the recovered nearby data at a new location.

One embodiment comprises a process for programming non-volatile storage, comprising programming a first set of data into a first set of non-volatile storage elements on a first die of a plurality of dies that communicate with a common controller, and prior to programming the first set of data, obtaining a copy of nearby data already stored in intended non-volatile storage elements on the first die, combining the obtained copy of the nearby data with copies of data from other of the die, recovering at least a portion of the nearby data from the combined copy of the nearby data with copies of the data from other dies, and storing the recovered nearby data at a new location if the respective set of data does not program properly.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

What is claimed is:

1. A process for programming non-volatile storage, comprising:

programming multiple sets of data to targeted non-volatile storage elements in different memory die of a plurality of memory dies; and for each set of data: obtaining a copy of nearby data already stored near and in a same die as respective targeted non-volatile storage elements prior to said programming and combining the obtained copy of the nearby data with copies of data from other memory die to create a combined copy, if the respective set of data does not program properly during said programming then recovering at least a portion of the nearby data from the combined copy and storing the recovered nearby data at a new location in the plurality of memory dies.

2. The process of claim 1, further comprising:

releasing at least a portion of the copy of nearby data if the respective set of data was programmed correctly.

3. The process of claim 1, wherein:

the nearby data is stored on proximate word lines with respect to the respective set of data;

the proximate word lines includes a first word line, a second word line adjacent to the first word line and a third word line adjacent to the second word line;

the respective set of data is programmed into a first set of non-volatile storage elements connected to the second word line;

the respective set of data comprise a first page of data; and the nearby data include an additional page of data on the second word line and additional pages of data on the first word line and third word line.

4. The process of claim 1, wherein:

the combining the obtained copy of the nearby data with copies of data from other memory die comprises performing an XOR operation on the obtained copy of the nearby data and copies of data from other memory die.

5. The process of claim 4, further comprising:

removing the obtained copy of the nearby data from the combined copy if the respective set of data was programmed correctly.

6. The process of claim 5, further comprising:

maintaining a data structure indicating which portions of which die are included in the combined copy.

7. The process of claim 1, wherein:

the combining the obtained copy of the nearby data with copies of data from other memory die includes combing nearby data for a first location on a first die with data for a corresponding location in a second die.

8. The process of claim 1, wherein:

maintaining four data structures on a controller in communication with the different memory die;

the four data structures store the combined data for the different memory die; and the four data structures include: a first data structure for storing data for odd word lines upper page, a second data structure for storing data for odd word lines lower page, a third data structure for storing data for even word line upper page and a fourth data structure for storing data for even word lines lower page.

9. A non-volatile storage system, comprising:

a plurality of memory dies, each of the memory dies including multiple non-volatile storage elements; and one or more control circuits configured for communication with the non-volatile storage elements of the plurality of memory dies, the one or more control circuits are configured to program multiple sets of data to targeted non-volatile storage elements of different memory die;

for each set of data: the one or more control circuits are configured to obtain a copy of nearby data already stored near and in a same die as respective targeted non-volatile storage elements prior to said programming and combine the obtained copy of the nearby data with copies of data from other memory die to create a combined copy, if the set of data does not program properly during said programming then the one or more control circuits recover at least a portion of the nearby data from the combined copy and store the recovered nearby data at a new location in the plurality of memory dies.

10. The apparatus of claim 9, wherein:

the one or more control circuits release at least a portion of the copy of nearby data if the respective set of data was programmed correctly.

11. The apparatus of claim 9, wherein:

the one or more control circuits combine the obtained copy of the nearby data with copies of data from other memory die by performing an XOR operation on the obtained copy of the nearby data and copies of data from other memory die.

12. The apparatus of claim 11, wherein:

the one or more control circuits remove the obtained copy of the nearby data from the combined copy if the respective set of data was programmed correctly.

13. The apparatus of claim 12, wherein:

the one or more control circuits maintain a data structure indicating which portions of which die are included in the combined copy.

14. The apparatus of claim 9, wherein:

the one or more control circuits combine the obtained copy of the nearby data with copies of data from other memory die by combining nearby data for a first location on a first die with data for a corresponding location in a second die.

15. The apparatus of claim 9, wherein:

the one or more control circuits include a controller in communication with the different memory die;

the controller maintains four data structures;

the four data structures store the combined data for the different memory die; and the four data structures include: a first data structure for storing data for odd word lines upper page, a second data structure for storing data for odd word lines lower page, a third data structure for storing data for even word line upper page and a fourth data structure for storing data for even word lines lower page.

16. A process for programming non-volatile storage, comprising:

programming a first set of data into a first set of non-volatile storage elements on a first die of a plurality of dies that communicate with a common controller;

prior to programming the first set of data, obtaining a copy of nearby data already stored near the first set of non-volatile storage elements on the first die and combining the obtained copy of the nearby data with a copy of data from another die of the plurality of dies to create a combined copy; and subsequent to programming the first set of data, recovering at least a portion of the nearby data from the combined copy and storing the recovered nearby data at a new location in the plurality of dies if the respective set of data does not program properly.

17. The process of claim 16, further comprising:

releasing at least a portion of the copy of nearby data if the respective set of data was programmed correctly.

18. The process of claim 16, wherein:

the combining the obtained copy of the nearby data comprises performing an XOR operation on the obtained copy of the nearby data and the copy of data from the another die.

19. The process of claim 18, further comprising:

removing the obtained copy of the nearby data from the combined copy if the respective set of data was programmed correctly.

20. The process of claim 19, further comprising:

maintaining a data structure indicating which portions of which die are included in the combined copy.

* * * * *